(12) United States Patent
Nakata

(10) Patent No.: US 11,462,516 B2
(45) Date of Patent: Oct. 4, 2022

(54) METHOD OF MANUFACTURING SEMICONDUCTOR DEVICE

(71) Applicant: Mitsubishi Electric Corporation, Tokyo (JP)

(72) Inventor: Yosuke Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 12 days.

(21) Appl. No.: 17/220,604

(22) Filed: Apr. 1, 2021

(65) Prior Publication Data

US 2022/0028839 A1    Jan. 27, 2022

(30) Foreign Application Priority Data

Jul. 22, 2020  (JP) .............................. JP2020-125431

(51) Int. Cl.
| | |
|---|---|
| *H01L 25/00* | (2006.01) |
| *H01L 25/07* | (2006.01) |
| *H01L 23/00* | (2006.01) |
| *H01L 23/31* | (2006.01) |
| *H01L 21/48* | (2006.01) |
| *H01L 21/56* | (2006.01) |

(52) U.S. Cl.
CPC ........ *H01L 25/072* (2013.01); *H01L 21/4853* (2013.01); *H01L 21/565* (2013.01); *H01L 23/3121* (2013.01); *H01L 24/48* (2013.01); *H01L 25/50* (2013.01); *H01L 2224/48157* (2013.01); *H01L 2924/10272* (2013.01); *H01L 2924/13091* (2013.01)

(58) Field of Classification Search
CPC .. H01L 25/072; H01L 21/4853; H01L 21/565
See application file for complete search history.

(56) References Cited

U.S. PATENT DOCUMENTS

| | | | | |
|---|---|---|---|---|
| 11,260,662 B2 * | 3/2022 | Wanikawa | ........... | B41J 2/14233 |
| 11,273,642 B2 * | 3/2022 | Mikoshiba | ............ | B41J 2/1606 |
| 11,302,822 B2 * | 4/2022 | Liu | .................... | H01L 29/78633 |
| 11,320,573 B2 * | 5/2022 | Sakai | ................... | G02B 5/3083 |
| 11,342,392 B2 * | 5/2022 | Tang | .................... | H01L 27/307 |

FOREIGN PATENT DOCUMENTS

WO    2020/110170 A1    6/2020

\* cited by examiner

*Primary Examiner* — Thao P Le
(74) *Attorney, Agent, or Firm* — Studebaker & Brackett PC

(57) ABSTRACT

An object of the present disclosure is to provide a method of manufacturing a semiconductor device capable of suppressing an electrostatic breakdown in a configuration including a semiconductor element with a sense cell part. A method of manufacturing a semiconductor device according to the present disclosure includes: bonding each of semiconductor elements 1 and a relay substrate on a conductor plate; connecting each of signal pads of each of the semiconductor elements and each of control pads of the relay substrate by a wire; bonding a first electrode material on each of the semiconductor elements; bonding a second electrode material on the relay substrate; sealing the conductor plate, each of the semiconductor elements, the relay substrate, the first electrode material, and the second electrode material by a sealing resin; and grinding the sealing resin and removing the shorting part to expose part of the second electrode material.

13 Claims, 44 Drawing Sheets

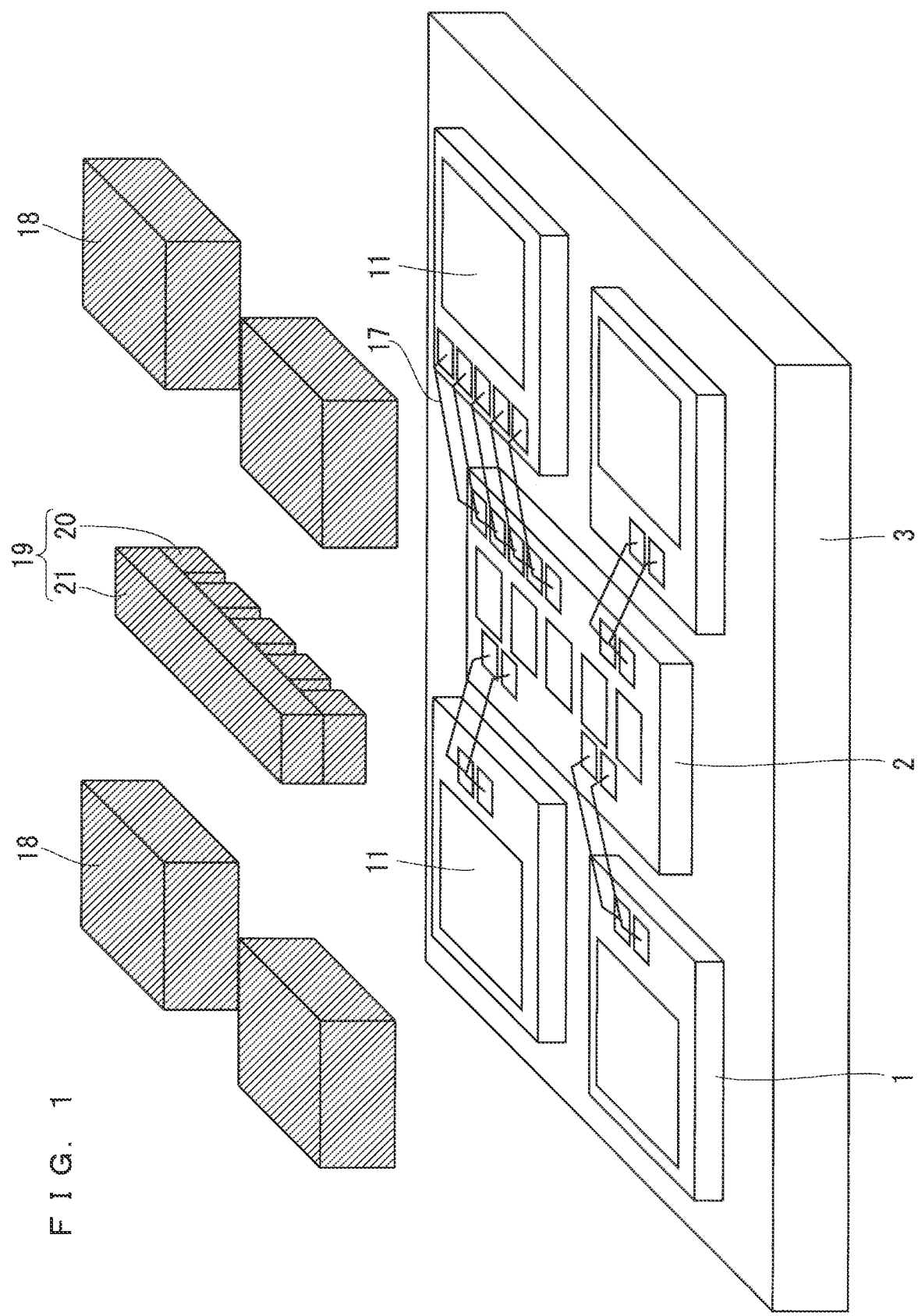
F I G. 1

F I G. 6
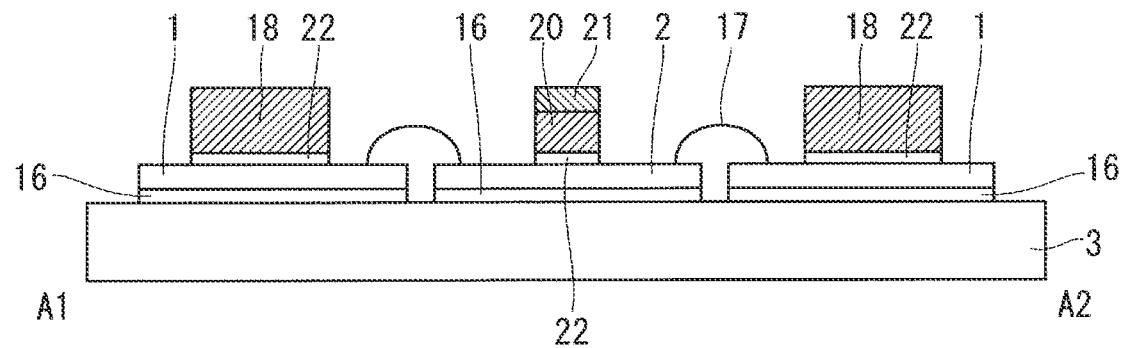

F I G. 1 2
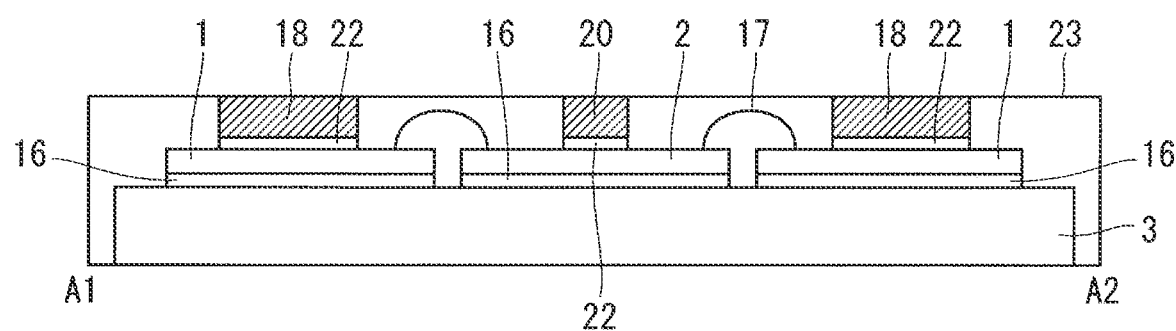

F I G. 19
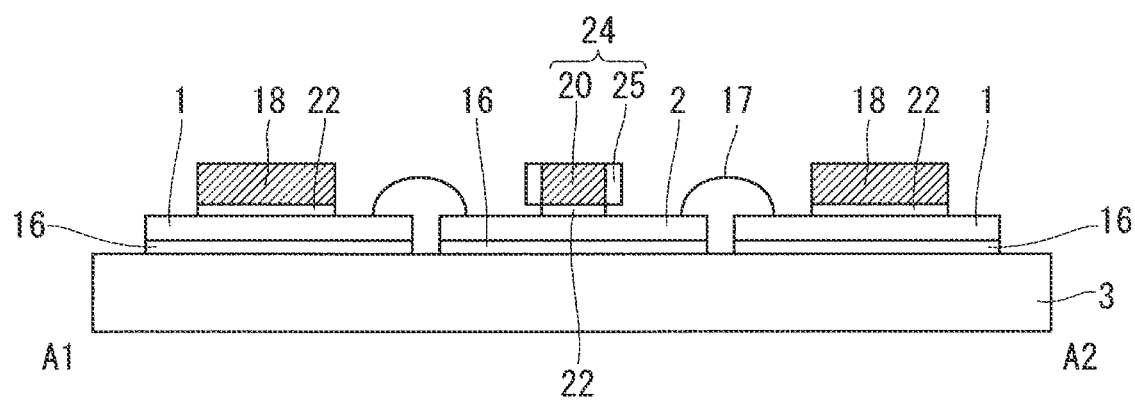

F I G. 3 1
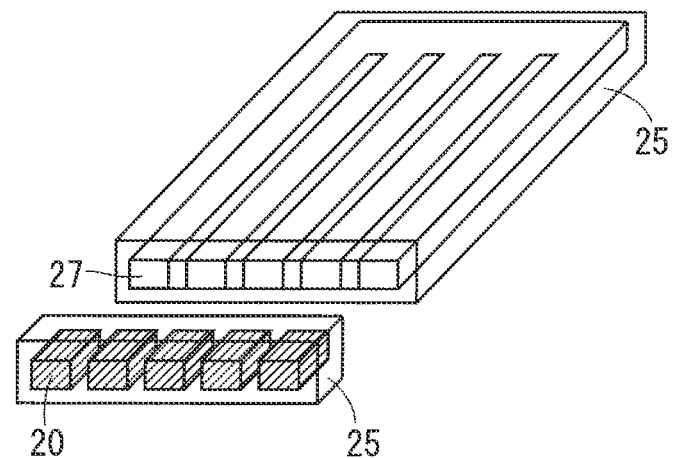

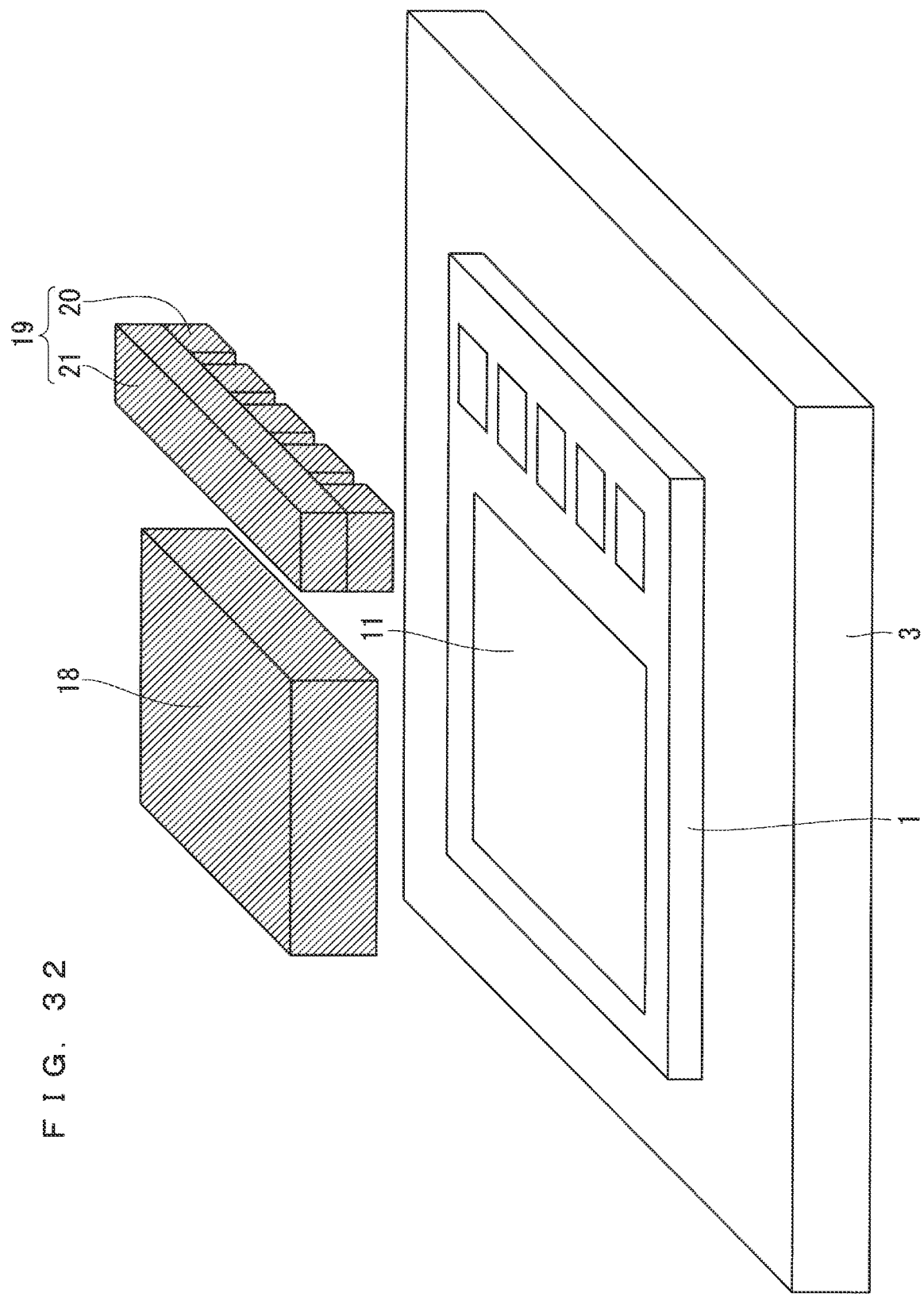

F I G. 3 4
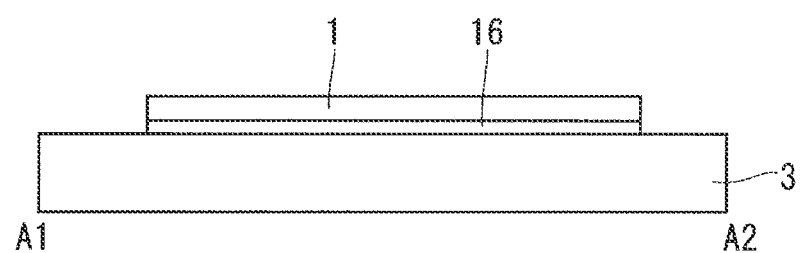

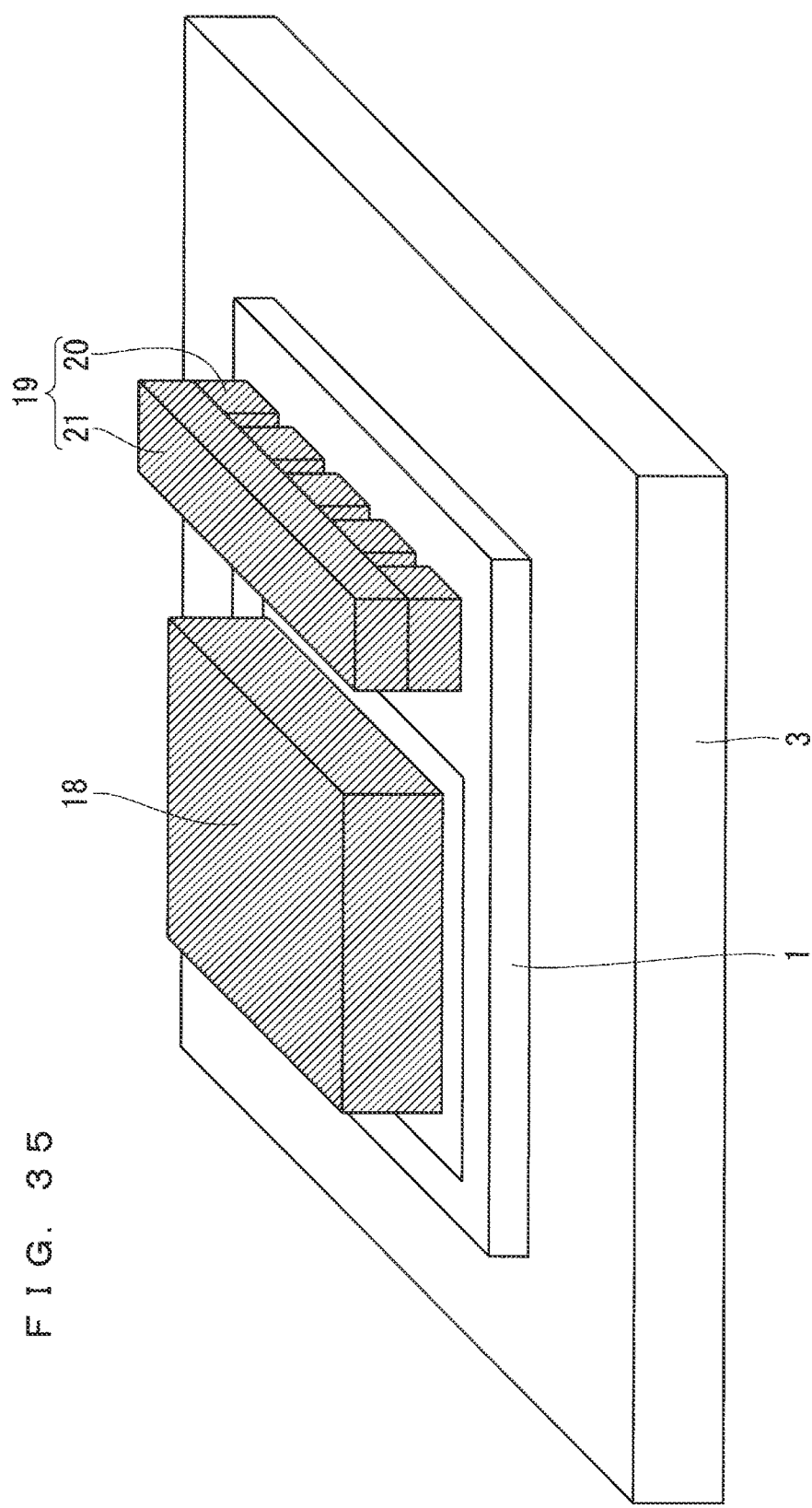

F I G. 3 6
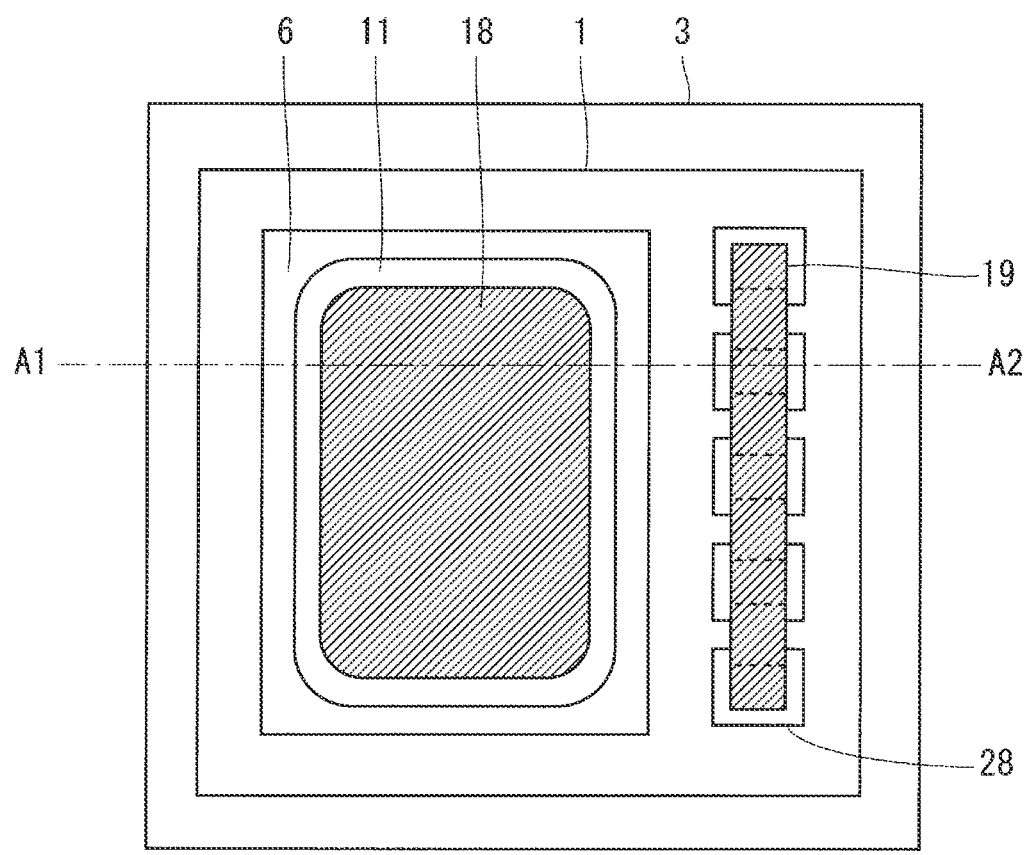

F I G. 4 0
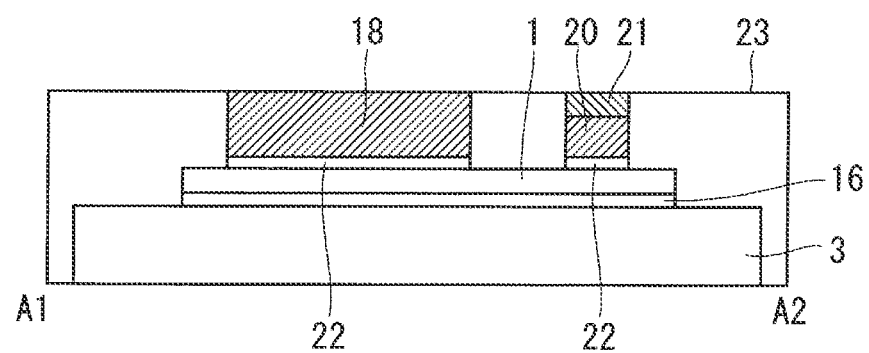

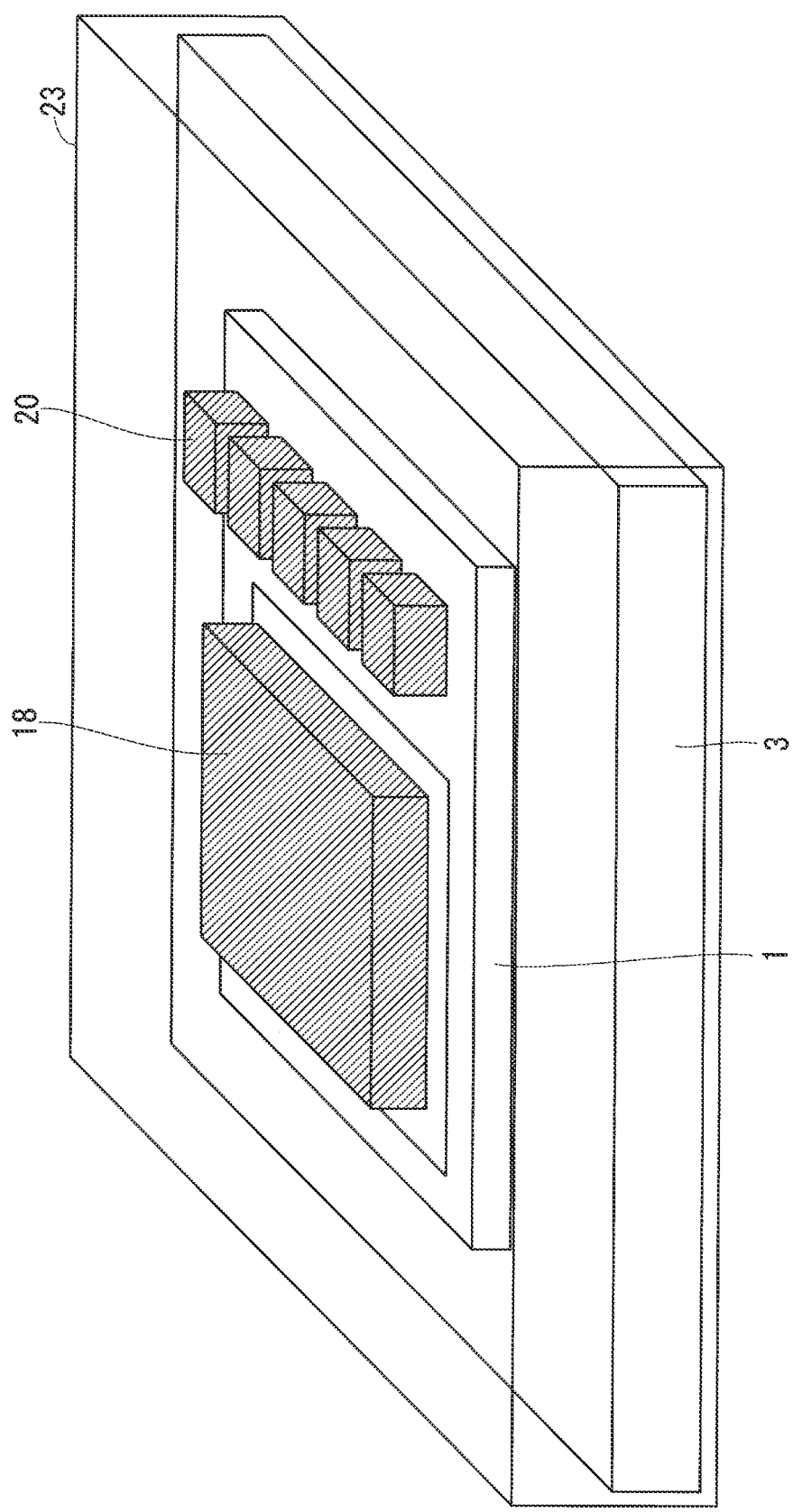
F I G. 41

F I G. 4 3
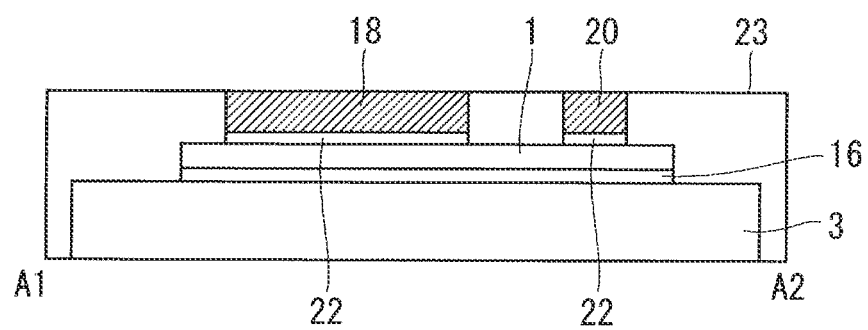

METHOD OF MANUFACTURING SEMICONDUCTOR DEVICE

FIELD OF THE INVENTION

The present disclosure relates to a method of manufacturing a semiconductor device including a semiconductor element with a sense cell part.

DESCRIPTION OF THE BACKGROUND ART

Conventionally disclosed is a semiconductor device manufactured through processes of bonding a wiring element (relay substrate) and a plurality of semiconductor elements on a conductor plate, parallelly connecting a control pad of each semiconductor element by an inner wiring (wiring pattern) formed on the wiring element, attaching a conductor piece (signal terminal) made of copper on the wiring element and sealing the conductor piece with a sealing resin, and polishing the sealing resin to expose each conductor piece to a surface (refer to International Publication No. 2020/110170, for example).

SUMMARY

In International Publication No. 2020/110170, for example, in a case where a semiconductor element including a main cell part and a sense cell part (for example, a current sense cell) having a smaller flow dividing ratio than the main cell part is sealed with a sealing resin, if the sealing resin covering a surrounding area of the semiconductor element takes charge, there is a problem that an electrostatic breakdown occurs in the sense cell part at a time of handling the semiconductor device, particularly at a time of grinding an upper surface of the sealing resin to expose each conductor piece, and a yield of the semiconductor device decreases. The sense cell part has a thin insulating film such as a gate oxide film and an interlayer film, for example, and excess voltage caused by static electricity breaks down such a structural body. Particularly, in a state where the control pad of each semiconductor element is independent from each other, when charge in the sealing resin passes the control terminal to the outside, a potential difference occurs between the control terminals and electrostatic breakdown resistance decreases in some cases.

An object of the present disclosure is to provide a method of manufacturing a semiconductor device capable of suppressing an electrostatic breakdown in a configuration including a semiconductor element with a sense cell part.

A method of manufacturing a semiconductor device according to the present disclosure includes: a plurality of semiconductor elements including a semiconductor element which has a main cell part and at least one sense cell part and is provided with a plurality of signal pads corresponding to the main cell part and the sense cell part, respectively; and a relay substrate provided with a plurality of control pads. The method includes: (a) bonding each of the semiconductor elements and the relay substrate on a conductor plate; (b) connecting each of the signal pads of each of the semiconductor elements and each of the control pads of the relay substrate by a wire; (c) bonding a first electrode material on each of the semiconductor elements; (d) bonding a second electrode material having a shorting part shorting each of the control pads on the relay substrate; (e) sealing the conductor plate, each of the semiconductor elements, the relay substrate, the first electrode material, and the second electrode material by resin; and (f) grinding the resin and removing the shorting part to expose part of the second electrode material.

According to the present disclosure, the method of manufacturing the semiconductor device includes the process of bonding the second electrode material having the shorting part shorting each of the control pads on the relay substrate, the process of sealing the conductor plate, each of the semiconductor elements, the relay substrate, the first electrode material, and the second electrode material by the resin, and the process of grinding the resin and removing the shorting part to expose the part of the second electrode material. Thus, an electrostatic breakdown can be suppressed in the configuration including the semiconductor element with the sense cell part.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a bird's eye view for describing a method of manufacturing a semiconductor device according to an embodiment 1.

FIG. 6 is a cross-sectional view for describing the method of manufacturing the semiconductor device according to the embodiment 1.

FIG. 12 is a cross-sectional view for describing the method of manufacturing the semiconductor device according to the embodiment 1.

FIG. 19 is a cross-sectional view for describing the method of manufacturing the semiconductor device according to the embodiment 2.

FIG. 31 is a diagram for describing the method of manufacturing the second electrode material according to the embodiment 2.

FIG. 32 is a bird's eye view for describing a method of manufacturing a semiconductor device according to an embodiment 3.

FIG. 34 is a cross-sectional view for describing the method of manufacturing the semiconductor device according to the embodiment 3.

FIG. 35 is a bird's eye view for describing the method of manufacturing the semiconductor device according to the embodiment 3.

FIG. 36 is a plan view for describing the method of manufacturing the semiconductor device according to the embodiment 3.

FIG. 40 is a cross-sectional view for describing the method of manufacturing the semiconductor device according to the embodiment 3.

FIG. 41 is a bird's eye view for describing the method of manufacturing the semiconductor device according to the embodiment 3.

FIG. 43 is a cross-sectional view for describing the method of manufacturing the semiconductor device according to the embodiment 3.

DESCRIPTION OF THE PREFERRED EMBODIMENTS

Embodiment 1

<1-1. Manufacturing Method>

Figure 13:
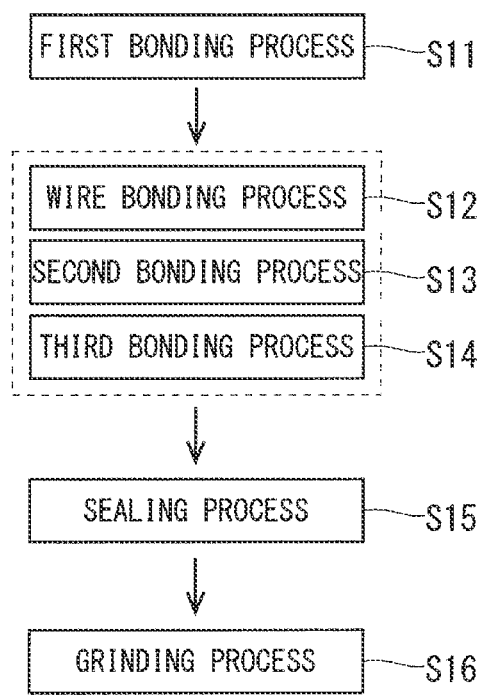
FIG. 13 is a flow chart illustrating an example of the method of manufacturing the semiconductor device according to the embodiment 1.
Figure 14:
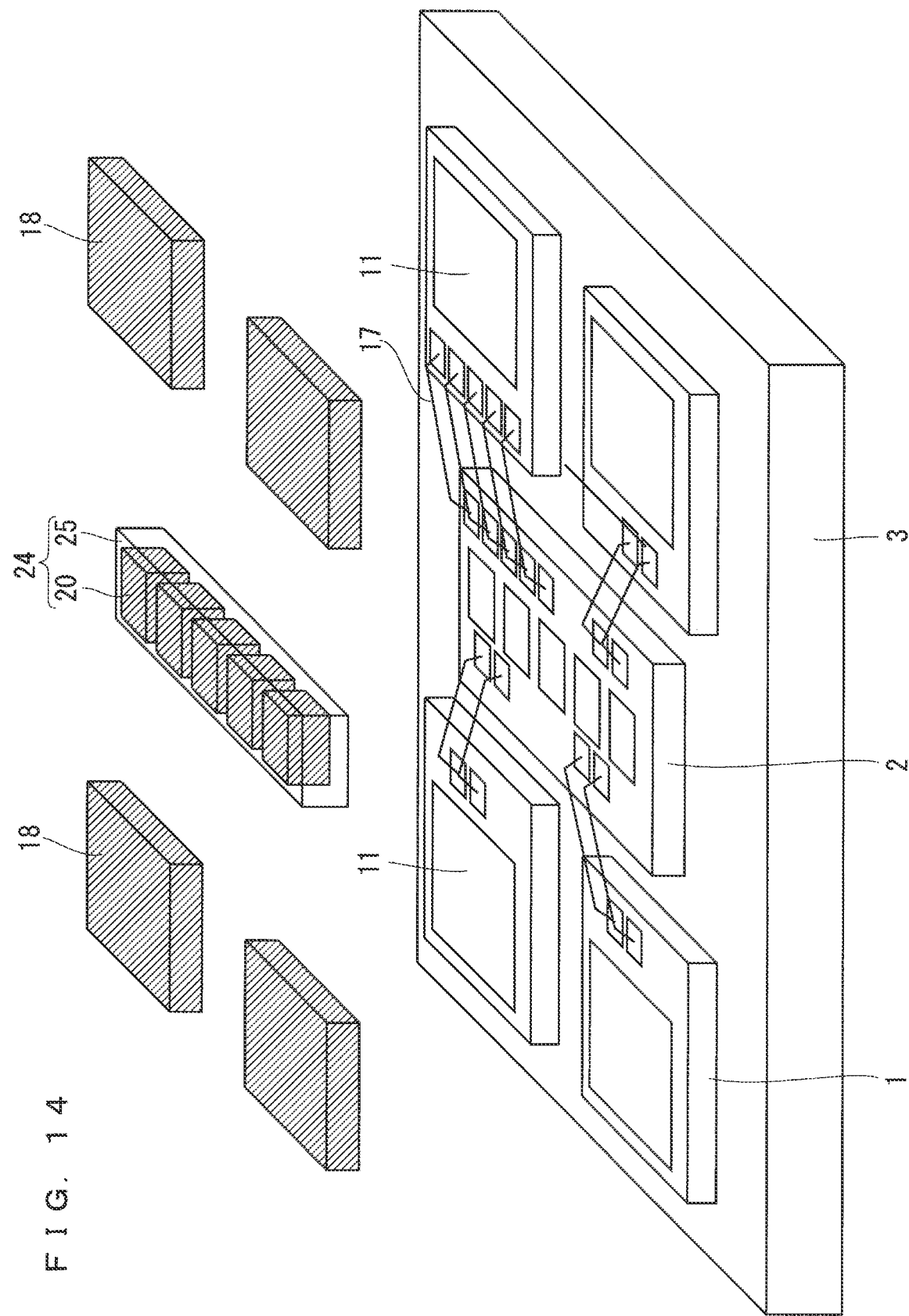
FIG. 14 is a bird's eye view for describing a method of manufacturing a semiconductor device according to an embodiment 2.
Figure 15:
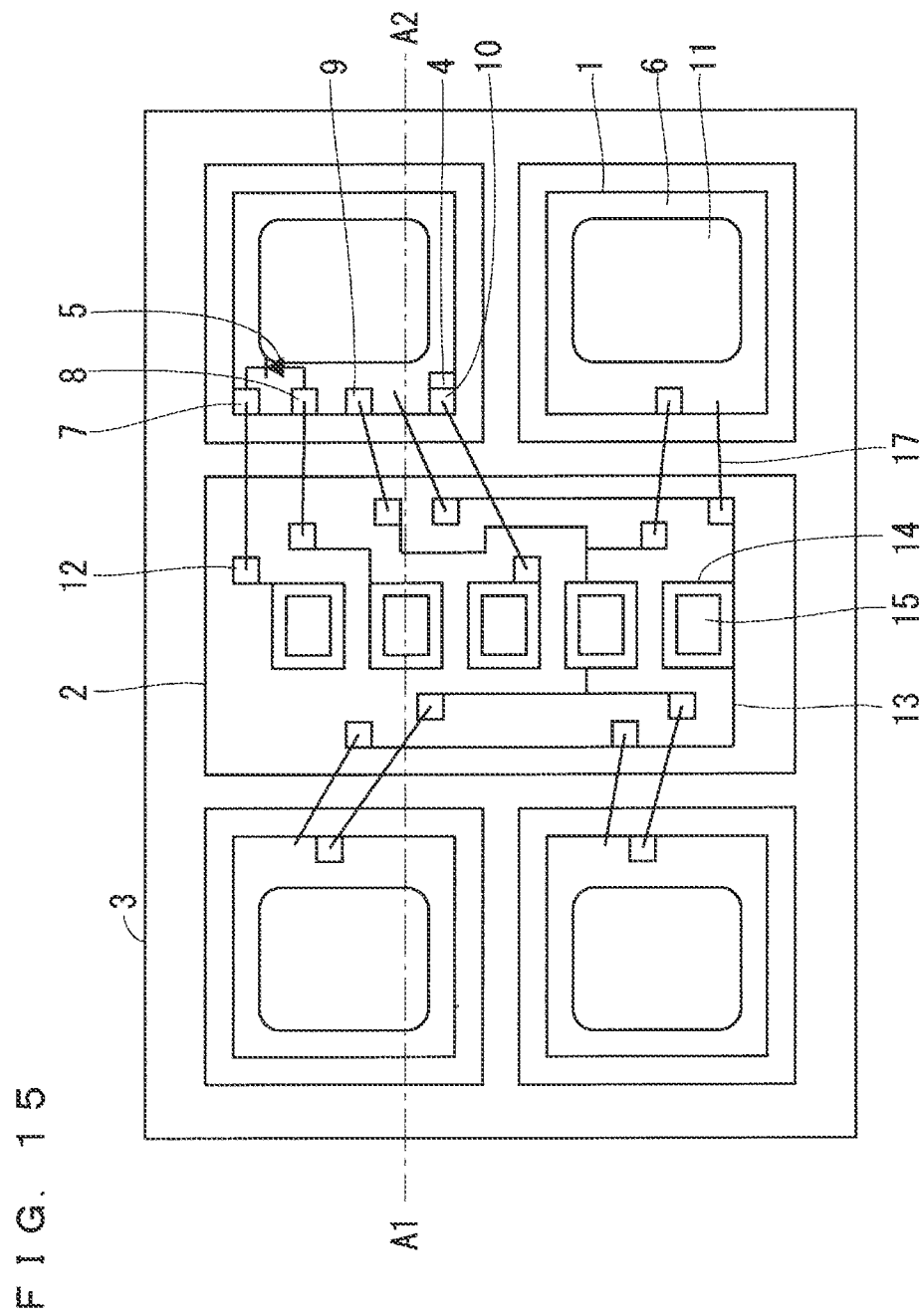
FIG. 15 is a plan view for describing the method of manufacturing the semiconductor device according to the embodiment 2.
Figure 16:
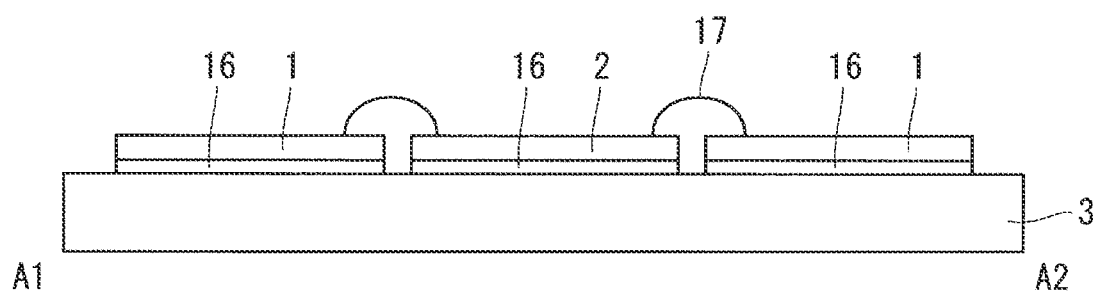
FIG. 16 is a cross-sectional view for describing the method of manufacturing the semiconductor device according to the embodiment 2.

FIGS. 1 to 12 are diagrams for describing a method of manufacturing a semiconductor device according to an embodiment 1. FIG. 13 is a flow chart illustrating an example of the method of manufacturing the semiconductor device according to the embodiment 1. The method of manufacturing the semiconductor device according to the embodiment 1 is described hereinafter with reference to FIGS. 1 to 13.

Figure 2:
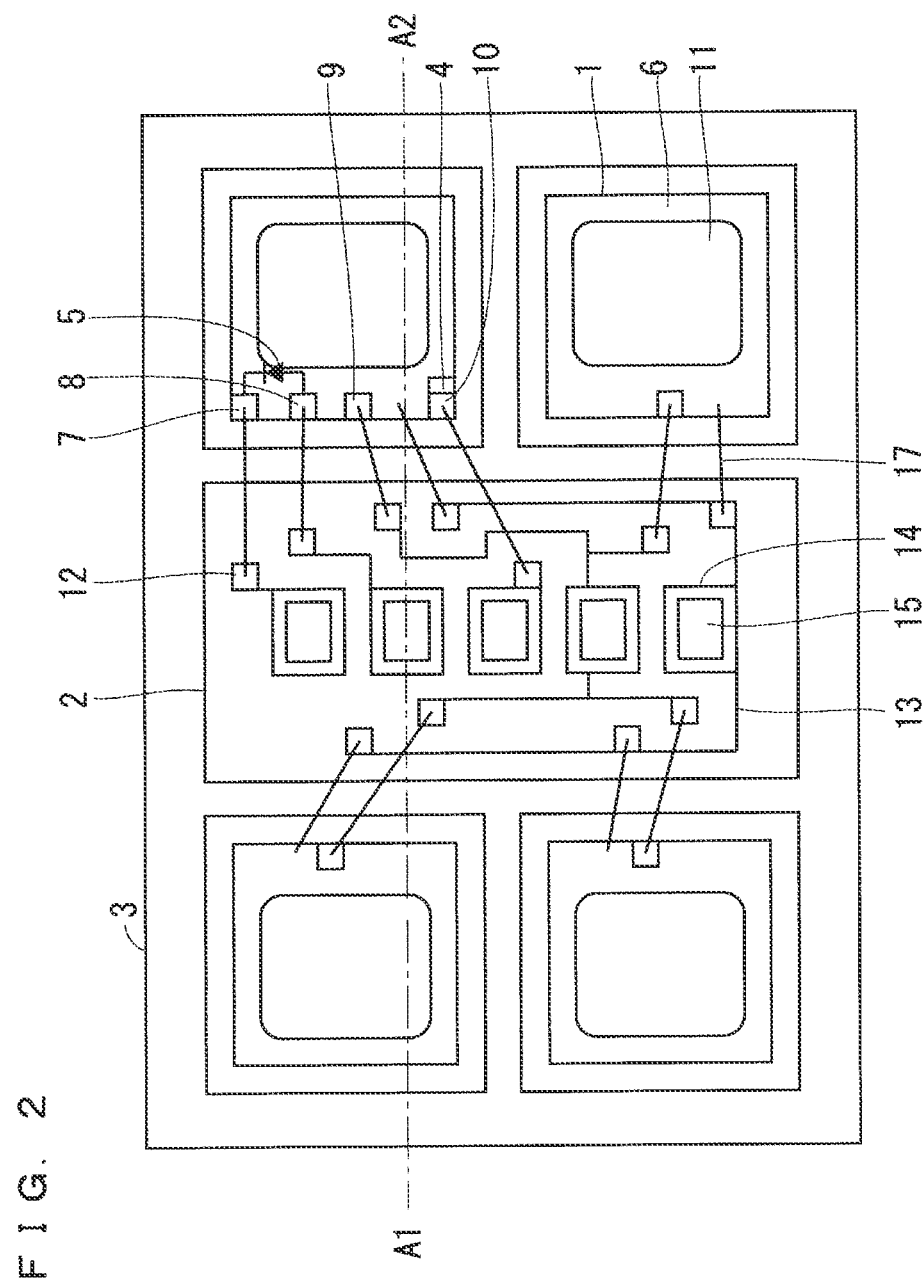
FIG. 2 is a plan view for describing the method of manufacturing the semiconductor device according to the embodiment 1.
Figure 3:
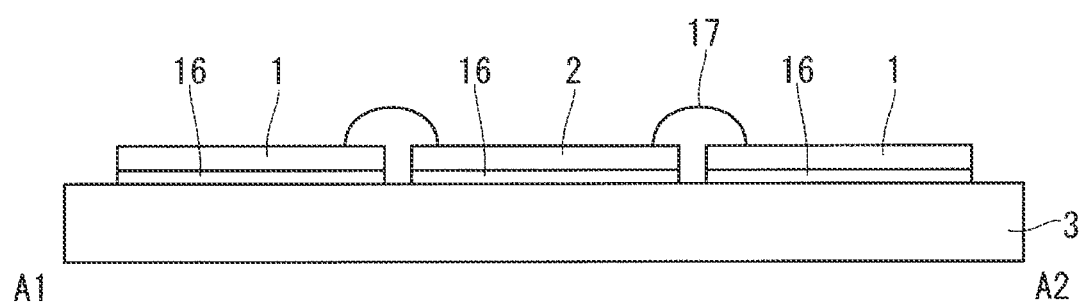
FIG. 3 is a cross-sectional view for describing the method of manufacturing the semiconductor device according to the embodiment 1.

As illustrated in FIGS. 1 to 3, in a first bonding process of Step S11 in FIG. 13, a relay substrate 2 and a plurality of semiconductor elements 1 are bonded on a conductor plate 3 using a bonding material 16.

The semiconductor element 1 is a composite compound semiconductor element made of SiC, for example, and is made up of a metal oxide semiconductor field effect transistor (MOSFET), for example. In the embodiment 1, the four semiconductor elements 1 are bonded on the conductor plate 3, and one of the four semiconductor elements 1 includes a main cell part and a sense cell part having a smaller flow dividing ratio than the main cell part. The other three semiconductor elements 1 do not include the sense cell part.

The sense cell part includes a current sense cell part 4 and a temperature sense diode part 5. In the current sense cell part 4, drain potential and gate potential are common to potential of the main cell part, however, source potential is different from potential of the main cell part. Accordingly, a source signal pad 10 corresponding to the source potential of the current sense cell part 4 is provided in the semiconductor element 1.

The temperature sense diode part 5 is formed of polysilicon, for example, and is insulated from the main cell part via an interlayer insulating film (not shown). The temperature sense diode part 5 includes an anode signal pad 8 and a cathode signal pad 7.

A source signal pad 6 in the main cell part and a gate signal pad 9 are provided in the semiconductor element 1. The source signal pad 6 can be formed using part of a region of the main cell part. Hereinafter, the source signal pad 6, the cathode signal pad 7, the anode signal pad 8, the gate signal pad 9, and the source signal pad 10 are collectively referred to as "the signal pad" in some cases. An electrode layer (not shown) is provided on an upper surface of each of the source signal pad 6, the cathode signal pad 7, the anode signal pad 8, the gate signal pad 9, the source signal pad 10, and the main cell part. The electrode layer is made of Al or Cu, for example, and can be formed by sputtering method.

A connection film 11 which can be sintering bonded is provided on the electrode layer. The connection film 11 is an NiP/Pd/Au lamination film, for example, and is formed by plating method. Alternately, the connection film 11 may be formed of an Ni/Au lamination film, an Au single layer film, or an Ag single layer film, for example, by sputtering method.

The relay substrate 2 is a substrate made of Si, for example. In the relay substrate 2, an insulating film (not shown) is provided on a surface, and a wiring part 13 which is a plurality of wiring patterns made of Al and a covering film (not shown) covering at least part of the wiring part 13, for example, are provided on the insulating film. The covering film is a film made of polyimide, for example.

A bonding film (not shown) is provided on a rear surface of the relay substrate 2. The bonding film is a Ti/Al/Ni/Au lamination film, for example, and can be formed by sputtering method. Alternately, it is also applicable that the bonding film is made by forming a Ti/Au lamination film by sputtering method and then forming an NiP/Au by plating method.

A plurality of first pad parts 12 and a plurality of second pad parts 14 are provided in the wiring part 13. The first pad part 12 includes a control pad corresponding to the source signal pad 6, a control pad corresponding to the cathode signal pad 7, a control pad corresponding to the anode signal pad 8, a control pad corresponding to the gate signal pad 9, and a control pad corresponding to the source signal pad 10.

The second pad part 14 (control terminal) is mainly used for inputting a signal in a burn-in test of a semiconductor package and taking out signal potential in assembling the semiconductor package to the semiconductor device. A connection film 15 which can be solder bonded or sintering bonded is provided on at least each second pad part 14. The connection film 15 is an NiP/Pd/Au lamination film, for example, and is formed by plating method. Alternately, the connection film 15 may be formed of an Ni/Au lamination film, an Au single layer film, or an Ag single layer film, for example, by sputtering method.

The conductor plate 3 is a plate material made of Cu, for example. The bonding material 16 is a sintered material made of Ag or Cu, for example. Each semiconductor element 1 and the relay substrate 2 are bonded on the conductor plate 3 via the bonding material 16 by a pressure bonding process or a pressureless bonding process.

As illustrated in FIGS. 1 to 3, in a wire bonding process of Step S12 in FIG. 13, a signal pad provided in each semiconductor element 1 and the first pad part 12 provided in the relay substrate 2 are connected by the wire 17. Specifically, the source signal pad 6 and the control pad corresponding thereto are connected by the wire 17, the cathode signal pad 7 and the control corresponding thereto are connected by the wire 17, the anode signal pad 8 and the control pad corresponding thereto are connected by the wire 17, the gate signal pad 9 and the control pad corresponding thereto are connected by the wire 17, and the source signal pad 10 and the control pad corresponding thereto are connected by the wire 17. The wire 17 is made of Au, Al, or Cu.

Figure 4:
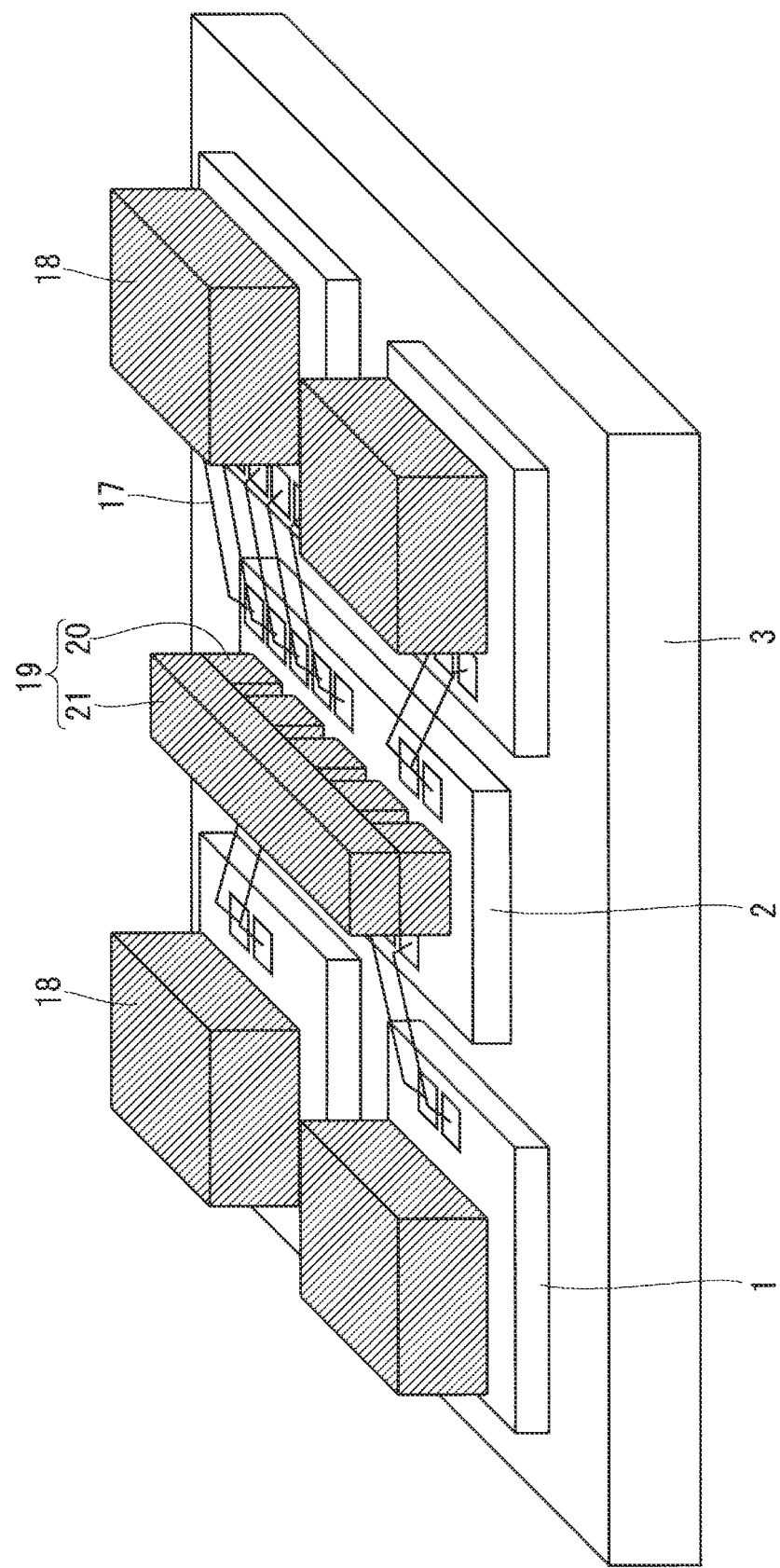
FIG. 4 is a bird's eye view for describing the method of manufacturing the semiconductor device according to the embodiment 1.
Figure 5:
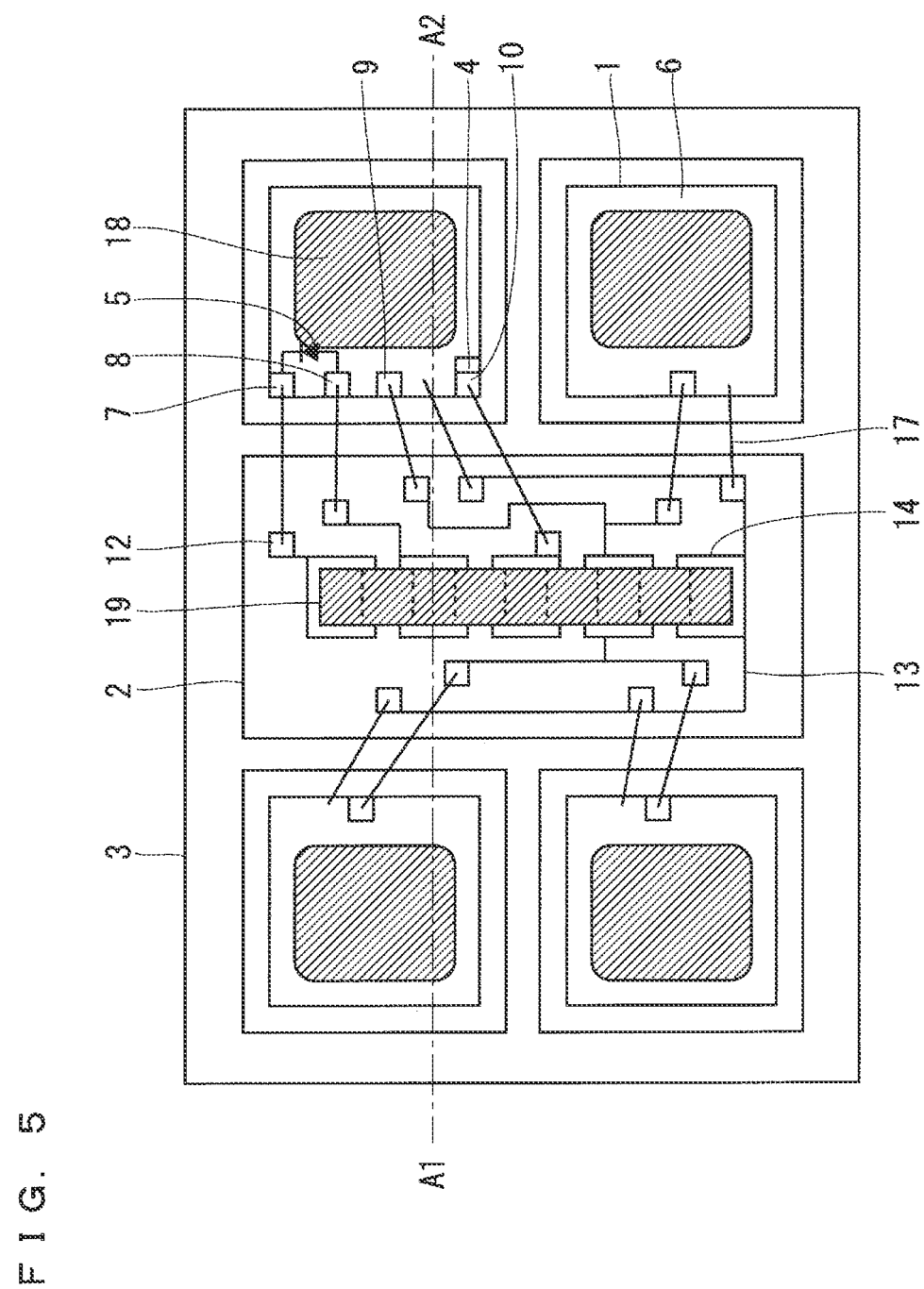
FIG. 5 is a plan view for describing the method of manufacturing the semiconductor device according to the embodiment 1.

As illustrated in FIGS. 4 to 6, in a second bonding process of Step S13 in FIG. 13, a first electrode material 18 is bonded to the connection film 11 provided on each semiconductor element 1 using a bonding material 22. The bonding material 22 is a sintering material made of Ag or Cu, for example. The first electrode material 18 is bonded to the connection film 11 via the boning material 22 by a pressure bonding process or a pressureless bonding process.

As illustrated in FIGS. 4 to 6, in a third bonding process of Step S14 in FIG. 13, a second electrode material 19 is bonded to the connection film 15 provided on each second pad part 14 of the relay substrate 2 using the bonding material 22. The second electrode material 19 includes a shorting part 21 and a plurality of connection parts 20. Each connection part 20 corresponds to each second pad part 14. The shorting part 21 shorts each connection part 20. Herein, the process of shorting each connection part 20 indicates a process of joining each connection part 20 so that potential of each connection part 20 is the same as each other.

Potential of each signal pad of each semiconductor element 1 is independent from each other at a time of finishing the wire bonding process of Step S12. That is to say, the potential of each signal pad of each semiconductor element 1 is electrically in an open-circuit state. In the third bonding process of subsequent Step S14, the second electrode material 19 is bonded to the connection film 15 provided on each second pad part 14, thus the potential of each signal pad of each semiconductor element 1 becomes common potential. That is to say, the potential of each signal pad of each semiconductor element 1 is electrically in a short-circuit state.

Each process of Step S12, Step S13, and Step S14 described above is not necessarily performed in this order, but may be performed in any order.

Figure 7:
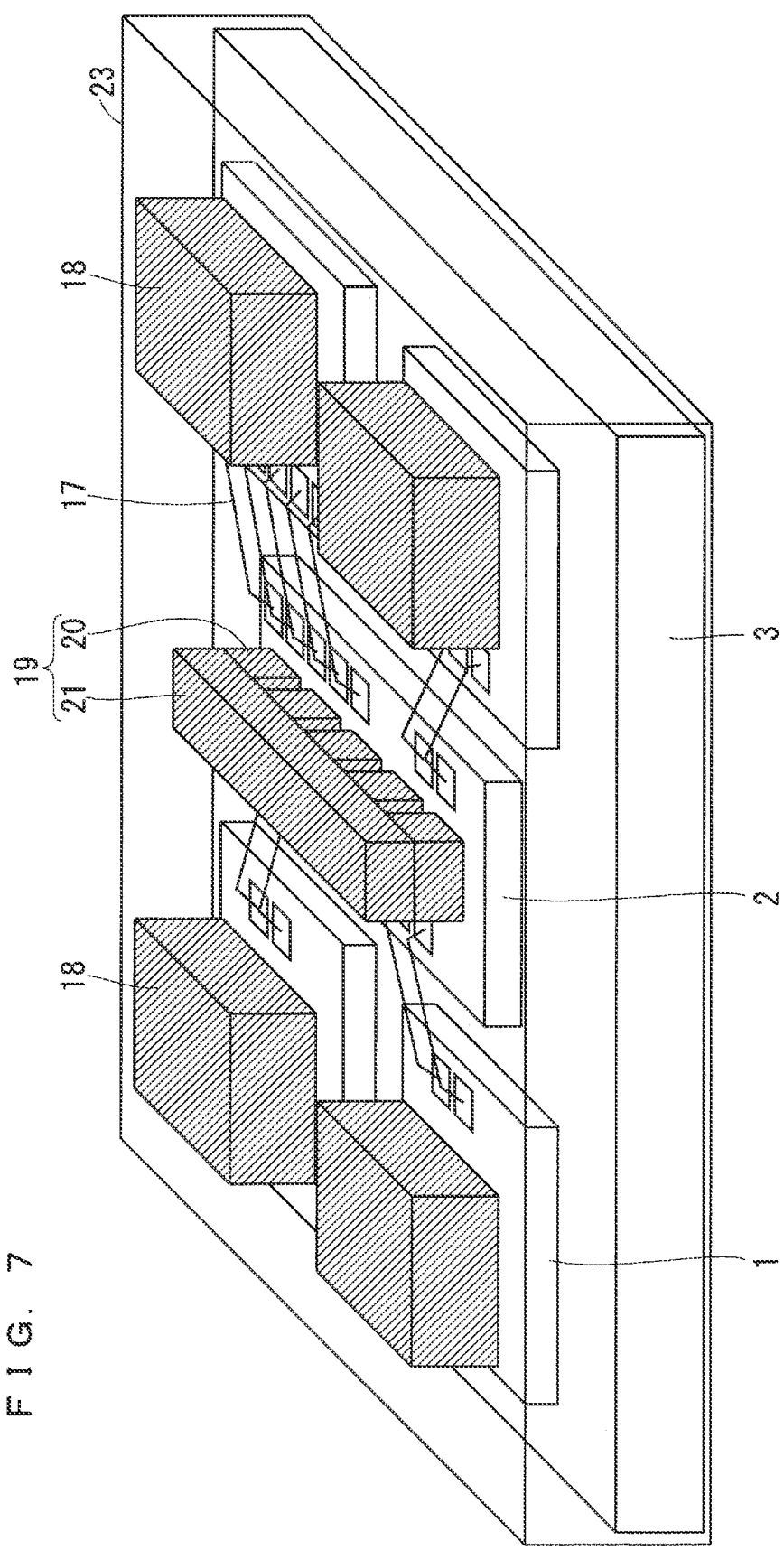
FIG. 7 is a bird's eye view for describing the method of manufacturing the semiconductor device according to the embodiment 1.
Figure 8:
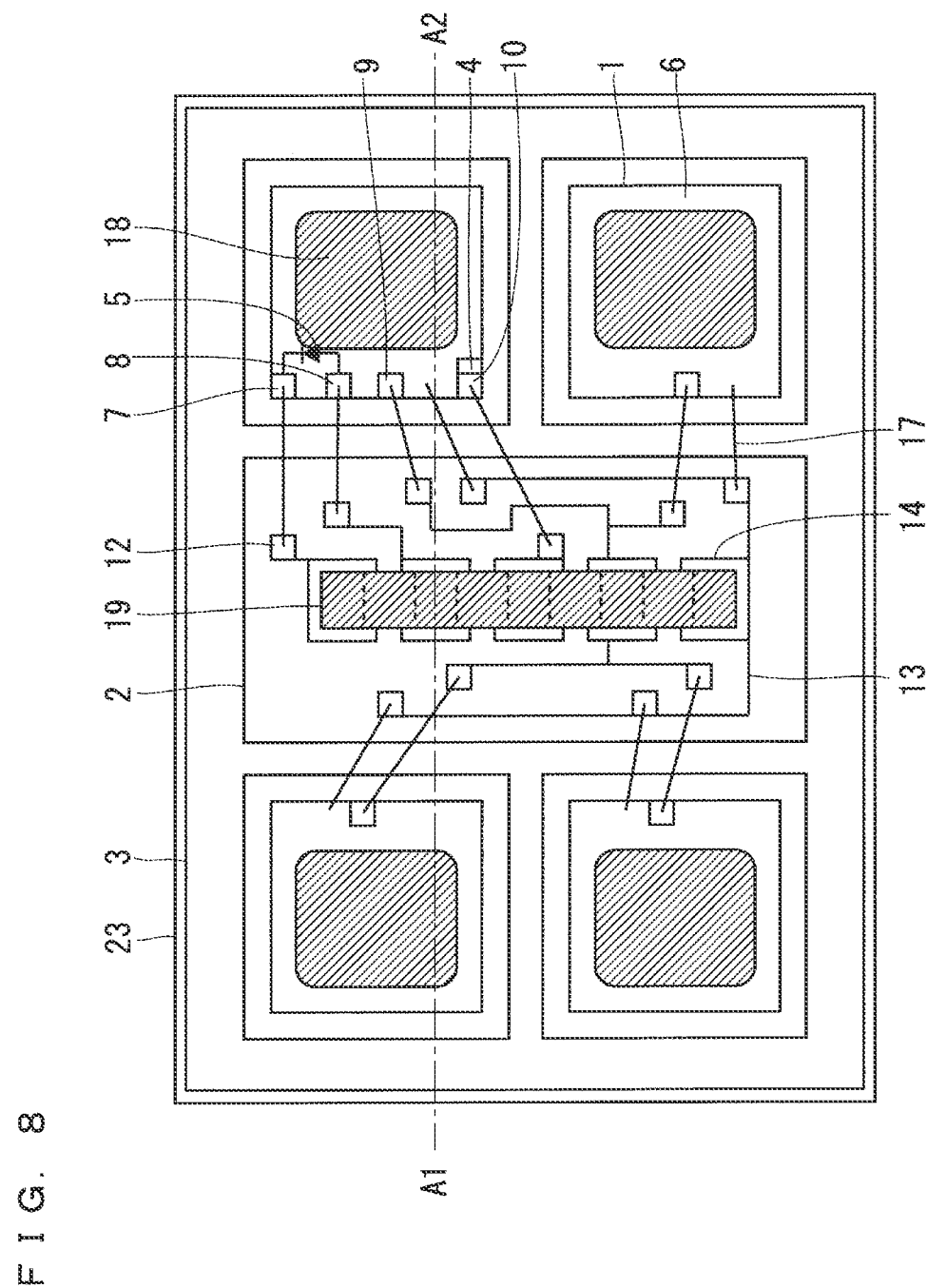
FIG. 8 is a plan view for describing the method of manufacturing the semiconductor device according to the embodiment 1.
Figure 9:
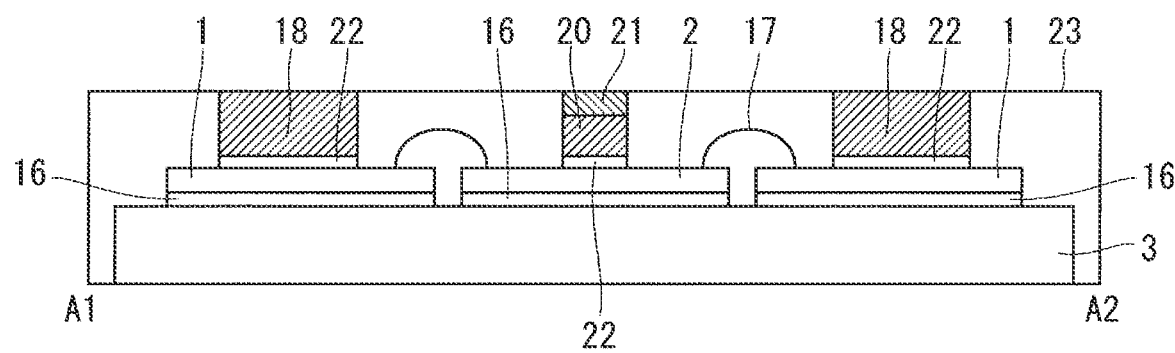
FIG. 9 is a cross-sectional view for describing the method of manufacturing the semiconductor device according to the embodiment 1.

As illustrated in FIGS. 7 to 9, in a sealing process of Step S15 in FIG. 13, each semiconductor element 1, the relay substrate 2, the conductor body 3, the first electrode material 18, and at least part of the second electrode material 19 is sealed and fixed with the sealing resin 23. In the sealing process, the sealing is performed using transfer molding method, for example. In the example in FIGS. 7 to 9, surfaces of the first electrode material 18 and the second electrode material 19 are exposed, but may be covered by the sealing resin 23.

The sealing resin 23 includes a filler and a thermoset resin. The filler and the thermoset resin are stirred, and then poured in a mold where the semiconductor device on which each process of Step S11 to Step S14 has been performed is housed. When the sealing resin 23 is poured in the mold and the thermoset resin is heat-treated, pressure is applied to form the sealing resin 23 with high density.

Figure 10:
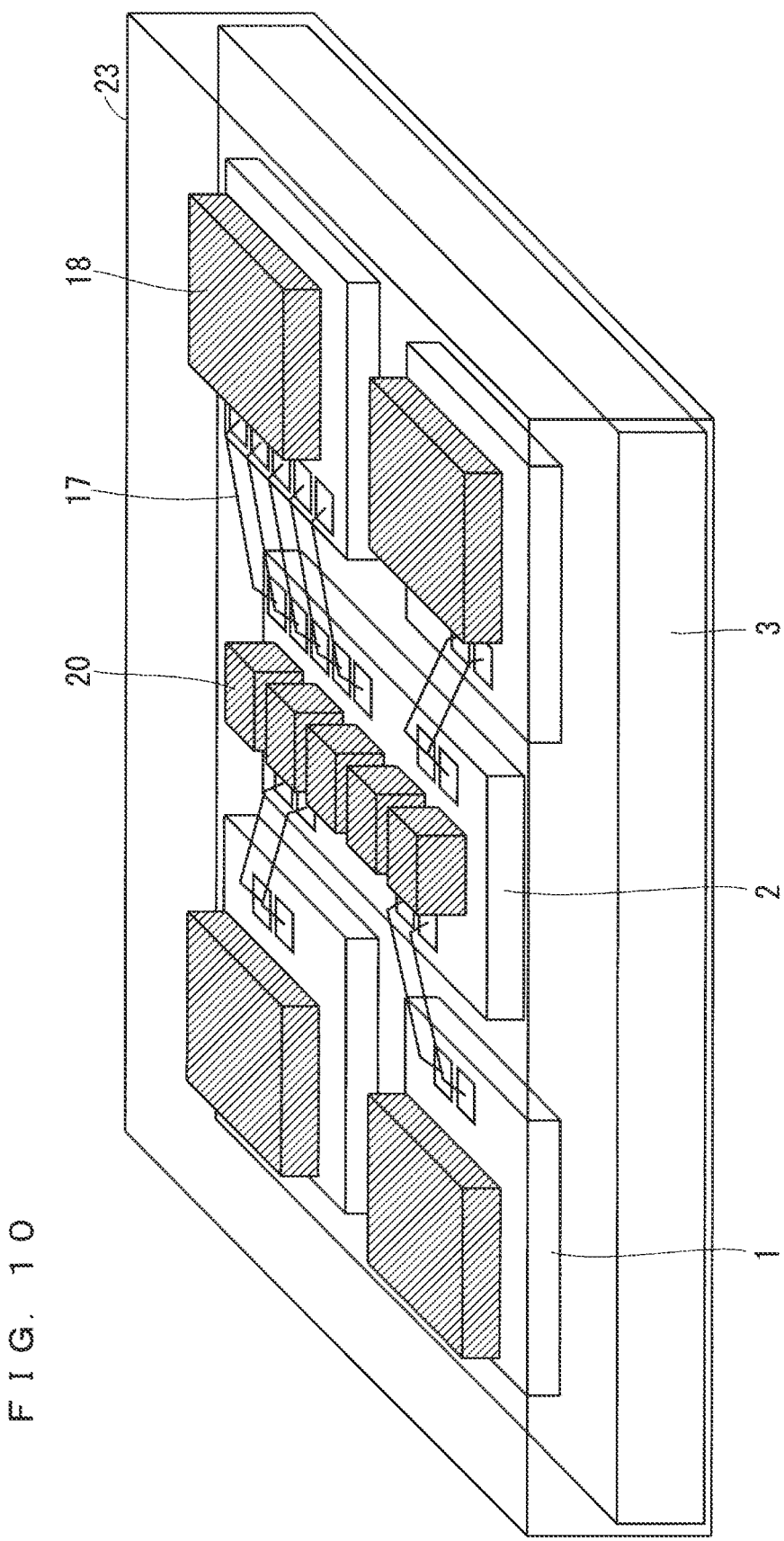
FIG. 10 is a bird's eye view for describing the method of manufacturing the semiconductor device according to the embodiment 1.
Figure 11:
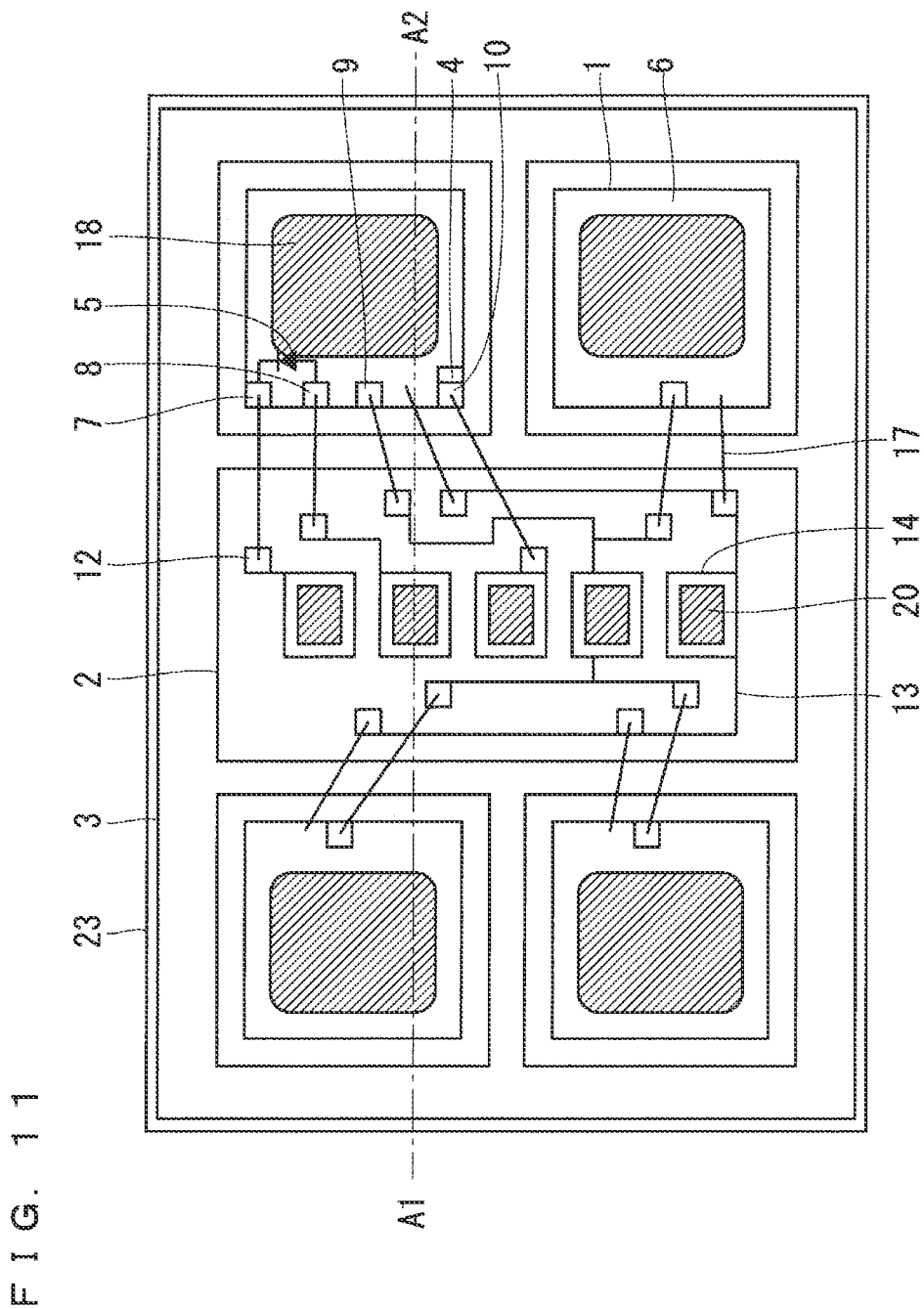
FIG. 11 is a plan view for describing the method of manufacturing the semiconductor device according to the embodiment 1.

As illustrated in FIGS. 10 to 12, in the grinding process of Step S16 in FIG. 13, the grinding process is performed so that at least part of the first electrode material 18 and at least part of the second electrode material 19 are exposed. At this time, the shorting part 21 of the second electrode material 19 is removed by grinding, and each connection part 20 remains as it is. Accordingly, the potential of each signal pad of each semiconductor element 1 is electrically in the open-circuit state.

In a sealing process of Step S15, a rear surface of the conductor plate 3 is pressed against a lower surface of the mold, thus the sealing resin 23 is not designed to cover the rear surface of the conductor plate 3. However, when a small amount of sealing resin 23 adheres to the rear surface of the conductor plate 3 or is oxidized in performing the resin process, the sealing resin 23 adhering to the rear surface or an oxidized portion is ground in the grinding process, thus mountability of the semiconductor device can be improved.

The semiconductor device according to the embodiment 1 is completed through each process of Step S11 to Step S16 described above.

A larger circuit can be made using the plurality of semiconductor devices according to the embodiment 1. For example, an equivalent circuit of the semiconductor device according to the embodiment 1 has a MOSFET for one phase, thus a half-bridge circuit can be made by using and mounting the two semiconductor devices to an insulating substrate with a circuit pattern, and a full-bridge circuit can be made by using the six semiconductor devices. Accordingly, the plurality of semiconductor devices according to the embodiment 1 are combined, thus various circuits such as a booster circuit can be achieved. After the semiconductor device according to the embodiment 1 is mounted on the insulating substrate with the circuit pattern, performed is a bonding of taking each signal electrode and main current electrode outside from each semiconductor device, and each semiconductor device and the insulating substrate with the circuit pattern are covered by a sealing material, thus a superior semiconductor device can be achieved.

<1-2. Effect>

After the sealing process of Step S15 in FIG. 13, an electrostatic breakdown of the sense cell part of the semiconductor element 1 can be prevented as much as possible even if an electrical discharge occurs from the charged sealing resin 23 to the outside via each semiconductor device 1. The sealing resin 23 is made up of an insulating material. The filler and the thermoset resin are stirred, and then injected around each semiconductor element 1. Static electricity tends to occur when the filler and the thermoset resin are stirred, and the sealing resin 23 takes charge easily because it is the insulating material. At the time of handling the semiconductor element 1, particularly in the grinding process of Step S16 in FIG. 13, when the charge in the sealing resin 23 around each semiconductor element 1 passes through the wire 17 and the relay substrate 2 from the signal pad and is discharged outside from the second electrode material 19, a potential difference occurs between the first pad parts 12. Voltage occurring due to the static electricity is sufficiently high to break the gate oxide film and the interlayer insulating film of the semiconductor element 1 in some cases. Accordingly, the gate oxide film is broken in some cases in the semiconductor element 1 having a small effective area ratio, that is to say, in the semiconductor element 1 having the current sense cell 4 having a small gate-source capacitance. The temperature sense diode part 5 is insulated from the main cell part by the interlayer insulating film, and the interlayer insulating film is broken by the static electricity in some cases.

In the embodiment 1, the second electrode material 19 having the shorting part 21 is provided, thus the first pad parts 12 are short-circuited from each other in the sealing process. Accordingly, it is possible to prevent the potential difference between the first pad parts 12 occurring when the charge in the sealing resin 23 around the semiconductor element 1 passes through the second electrode material 19 and is discharged outside, as much as possible. Accordingly, it is possible to prevent the breakdown of the insulating film in the current sense cell part 4 and the temperature sense diode part 5 as much as possible.

The second electrode material 19 includes not only the connection part 20 but also the shorting part 21. Accordingly, each connection part 20 corresponding to each second pad part 14 can be integrally formed, and operability and a positional accuracy at the time of bonding the second electrode material 19 to the relay substrate 2 can be improved. A pattern interval is normally determined by photoengraving in the second pad part 14, thus a tolerance is quite small, however, a tolerance in locating the second electrode material 19 is large. The second pad part 14 is small with respect to the tolerance in locating the second electrode material 19, thus a rotation of the second electrode material 19 also needs to be controlled. Furthermore, a state where the second electrode material 19 is obliquely connected for each second pad part 14 also needs to be prevented. When each connection part 20 of the second electrode material 19 is an independently-configured component (when the second electrode material 19 does not have the shorting part 21), there is a problem that a size of the second pad part 14 is increased in consideration of the tolerance described above, a connection tolerance of the second electrode material 19 is reduced, and the number of operations required for mounting the second electrode material 19 increases, for example. According to the embodiment 1, the second electrode material 19 is a component in which each connection part 20 and the shorting part 21 are integrally formed, thus the above problem can be resolved, and the semiconductor device can be manufactured easily.

A cost per unit area is higher in SiC than in Si, thus a cost of the semiconductor device can be reduced by designing the first pad part 12 to be small. The second pad part 14 needs to be designed to be large for a positional tolerance to be connected to an electrode material, however, the first pad part 12 connecting the wire 17 can be designed to be small, thus the cost of the semiconductor device can be reduced.

Embodiment 2

<2-1. Manufacturing Method>

FIGS. 14 to 28 are diagrams for describing a method of manufacturing a semiconductor device according to an embodiment 2. The method of manufacturing the semiconductor device according to the embodiment 2 is described hereinafter with reference to FIGS. 14 to 28, however, the description is mainly focused on a process different from the method of manufacturing the semiconductor device according to the embodiment 1. Each process of manufacturing the semiconductor device according to the embodiment 2 is similar to that in the flow chart illustrated in FIG. 13.

Figure 17:
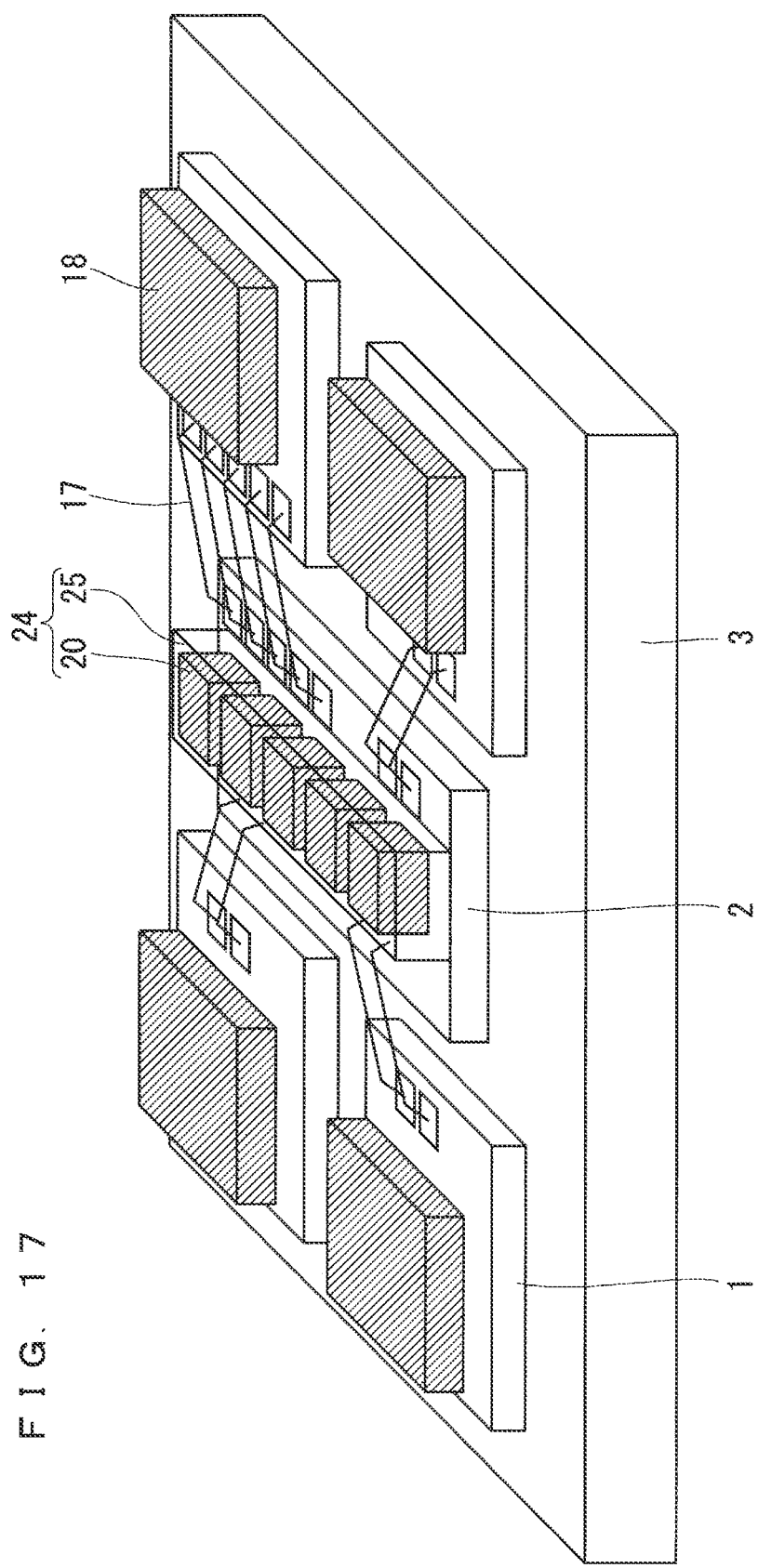
FIG. 17 is a bird's eye view for describing the method of manufacturing the semiconductor device according to the embodiment 2.
Figure 18:
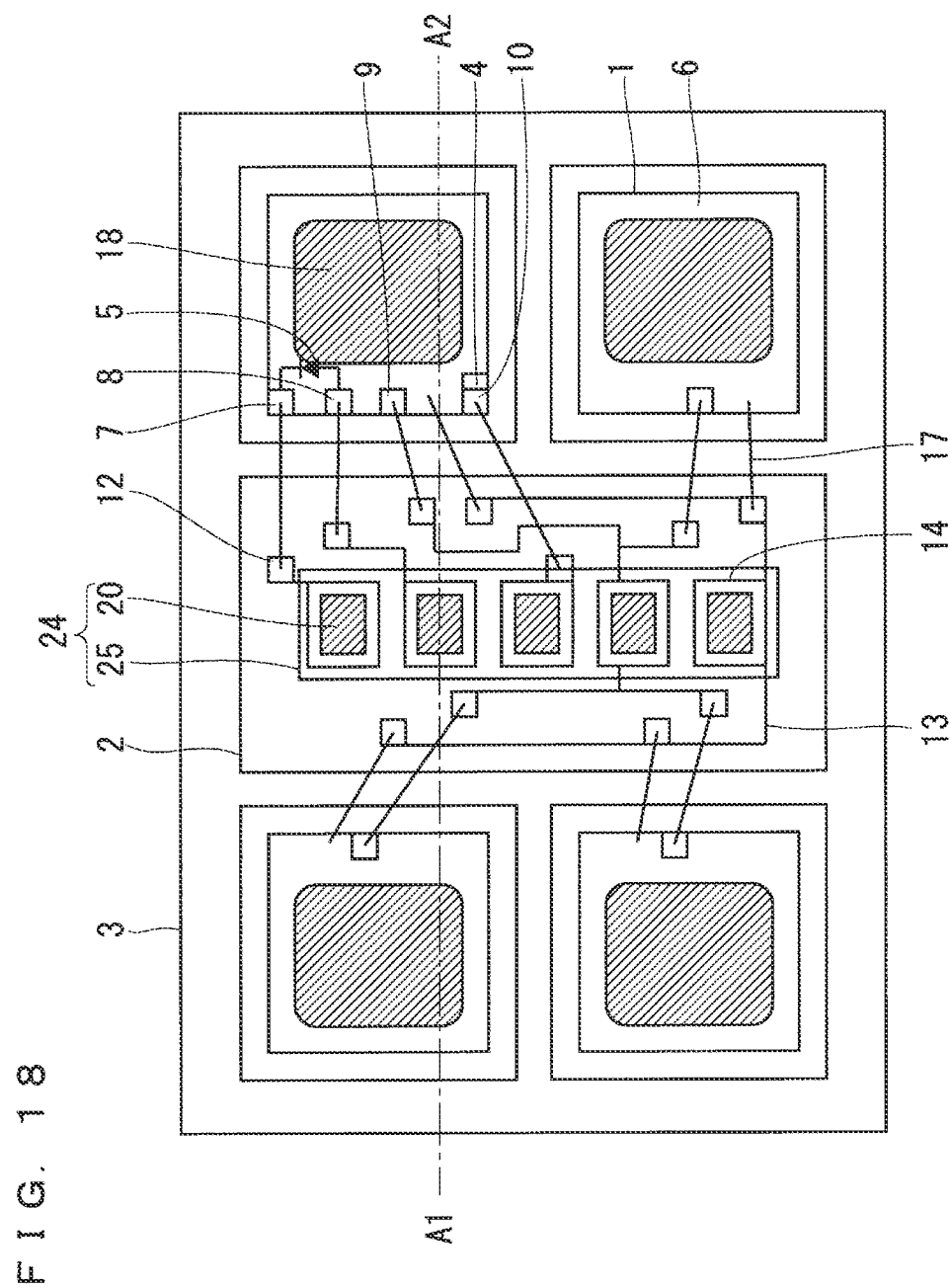
FIG. 18 is a plan view for describing the method of manufacturing the semiconductor device according to the embodiment 2.

As illustrated in FIGS. 17 to 19, in a third bonding process of Step S14 in FIG. 13, a second electrode material 24 is bonded to the connection film 15 provided on each second pad part 14 of the relay substrate 2 using the bonding material 22. The second electrode material 24 includes an insulating material 25 and the plurality of connection parts 20. The connection parts 20 are integrally formed by the insulating material 25, and are electrically in the open-circuit state.

Figure 20:
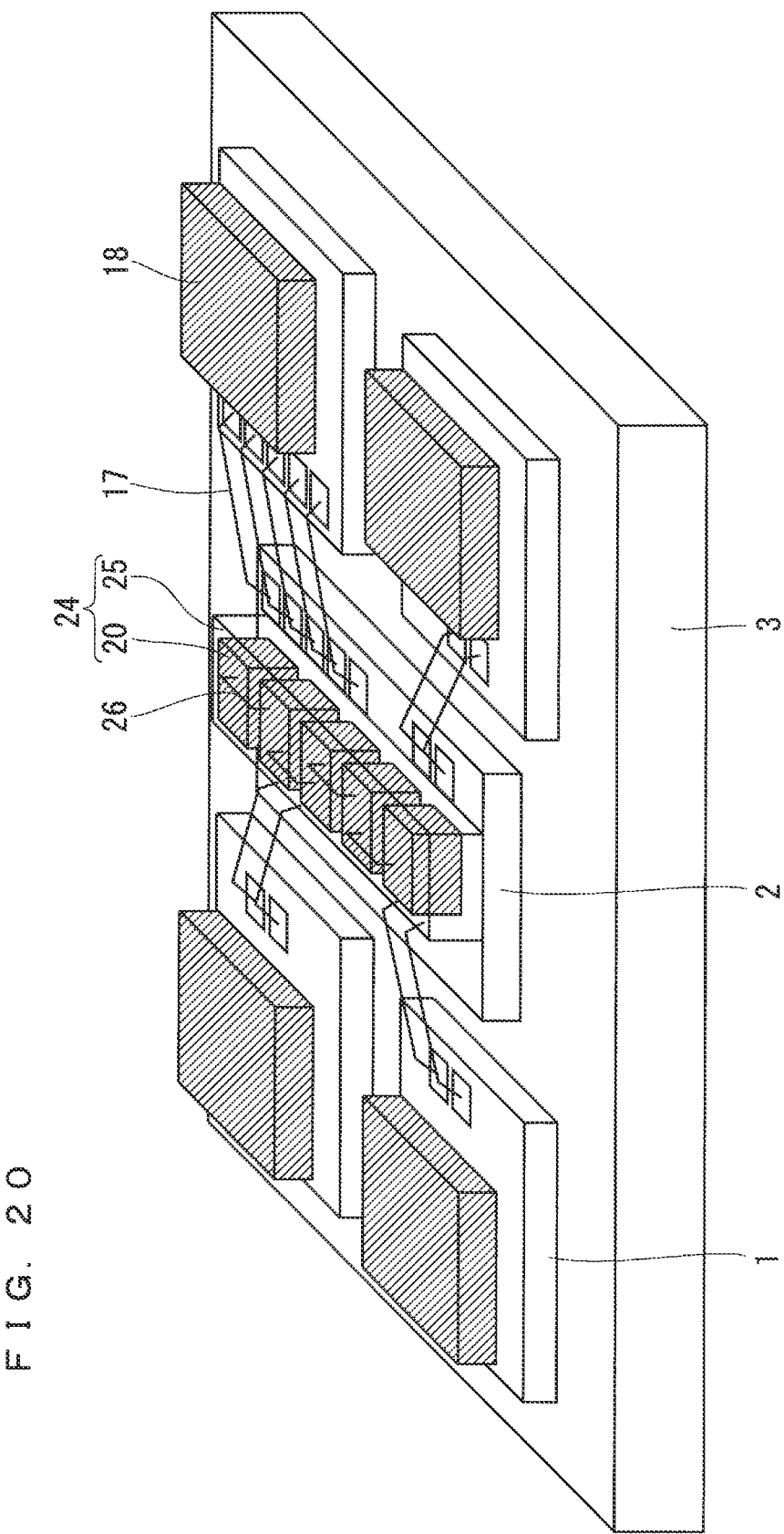
FIG. 20 is a bird's eye view for describing the method of manufacturing the semiconductor device according to the embodiment 2.
Figure 21:
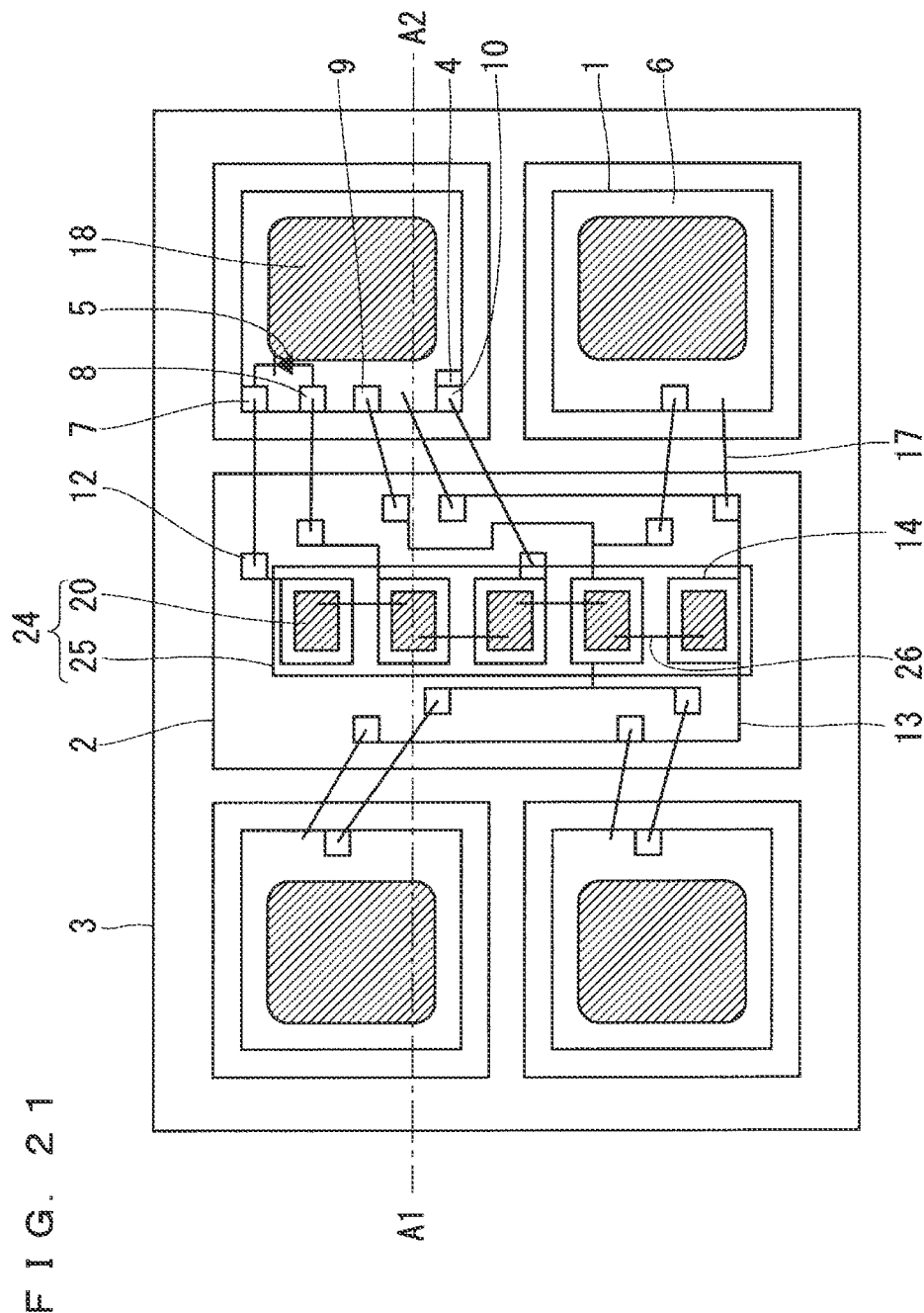
FIG. 21 is a plan view for describing the method of manufacturing the semiconductor device according to the embodiment 2.
Figure 22:
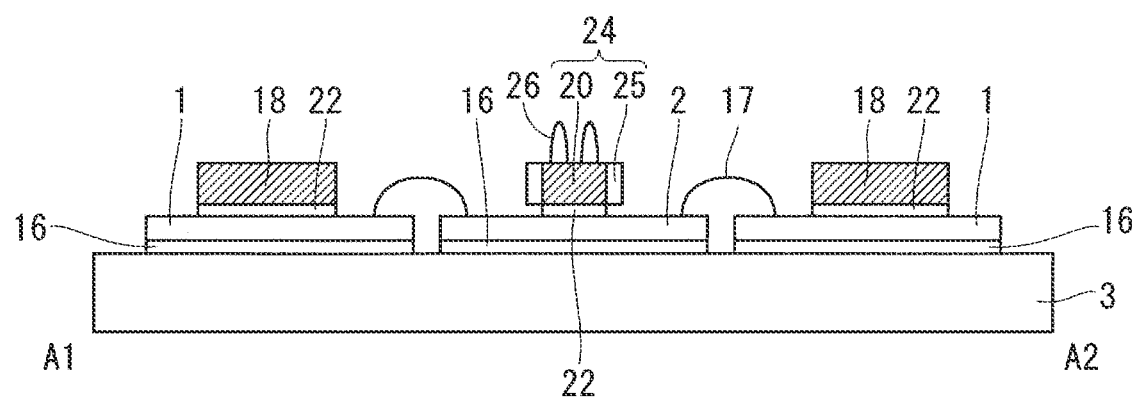
FIG. 22 is a cross-sectional view for describing the method of manufacturing the semiconductor device according to the embodiment 2.

Subsequently, as illustrated in FIGS. 20 to 22, the connection parts 20 adjacent to each other are connected by a shorting wire 26 to short each connection part 20. The connection is performed in the wire bonding process of Step S12 in FIG. 13. In this case, the wire bonding process of Step S12 is performed after the third bonding process of Step S14.

Figure 23:
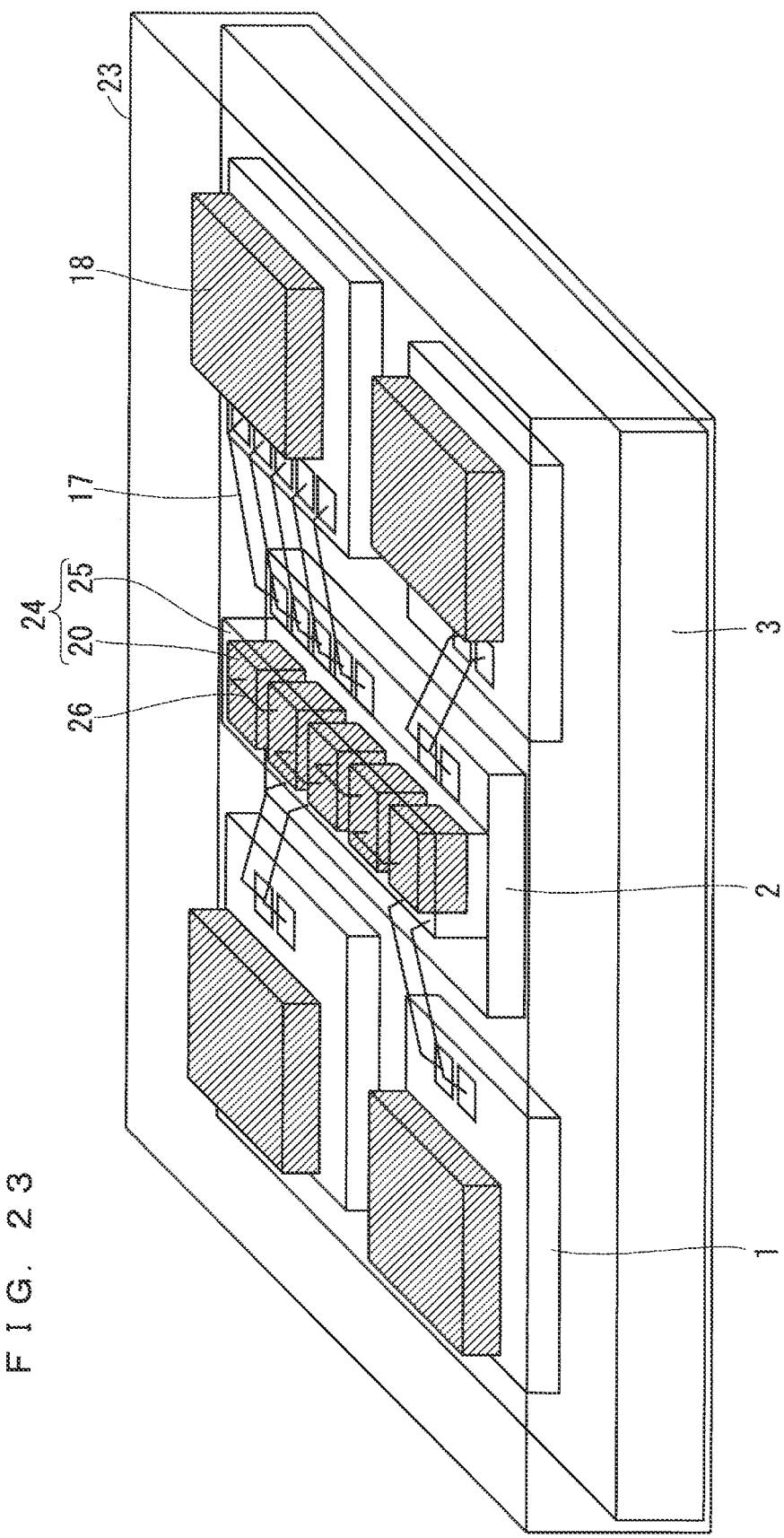
FIG. 23 is a bird's eye view for describing the method of manufacturing the semiconductor device according to the embodiment 2.
Figure 24:
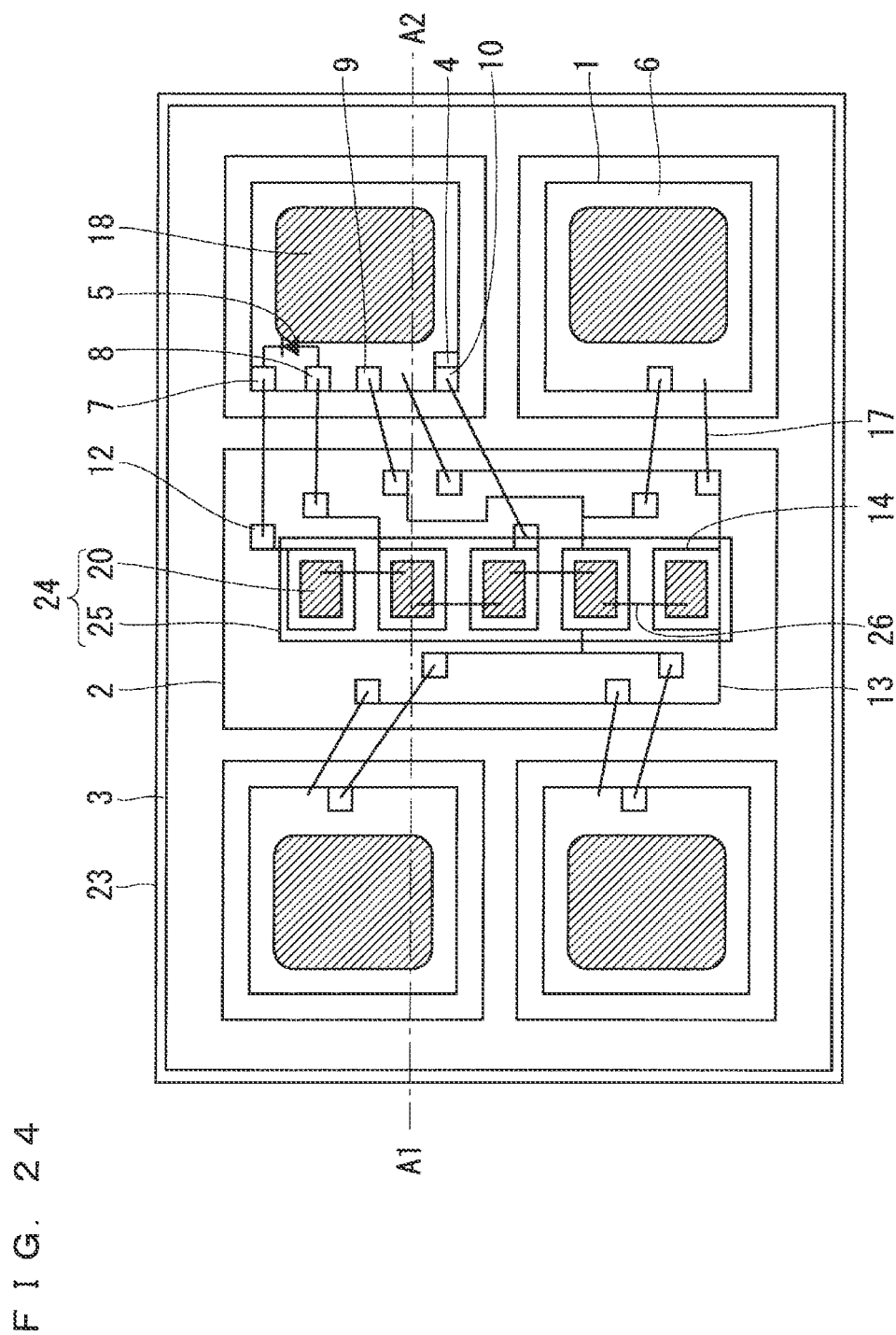
FIG. 24 is a plan view for describing the method of manufacturing the semiconductor device according to the embodiment 2.
Figure 25:
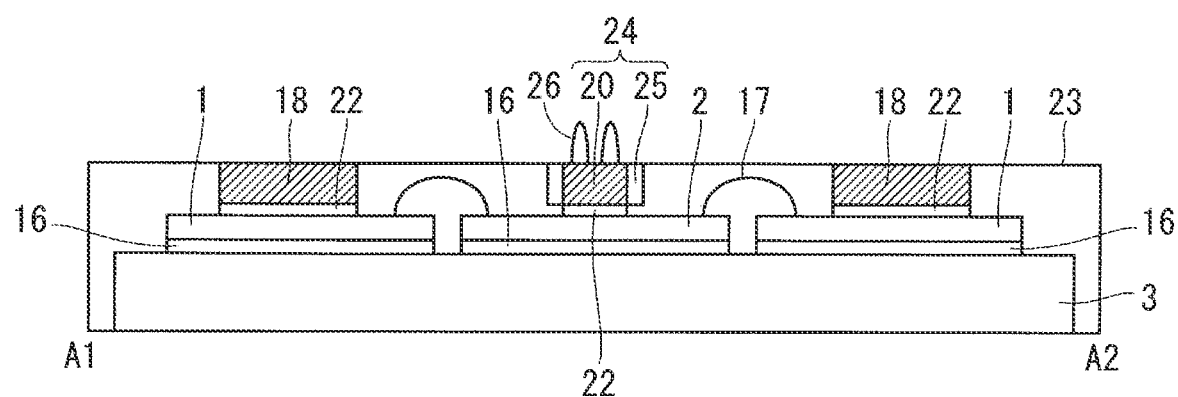
FIG. 25 is a cross-sectional view for describing the method of manufacturing the semiconductor device according to the embodiment 2.

As illustrated in FIGS. 23 to 25, in the sealing process of Step S15 in FIG. 13, each semiconductor element 1, the relay substrate 2, the conductor body 3, the first electrode material 18, and at least part of the second electrode material 24 is sealed and fixed with the sealing resin 23. In the example in FIGS. 23 to 25, surfaces of the first electrode material 18 and the second electrode material 24 are exposed, but may be covered by the sealing resin 23.

Figure 26:
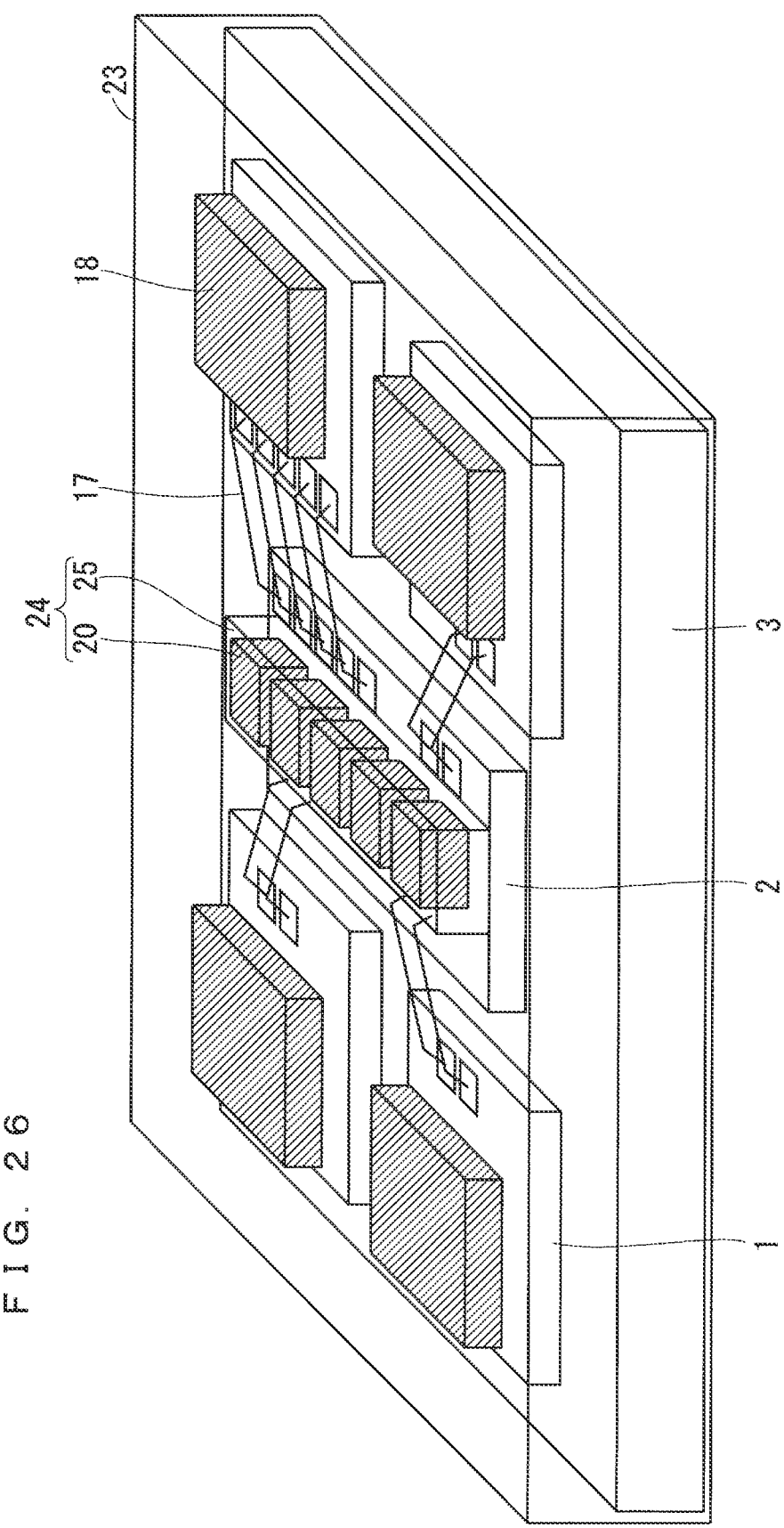
FIG. 26 is a bird's eye view for describing the method of manufacturing the semiconductor device according to the embodiment 2.
Figure 27:
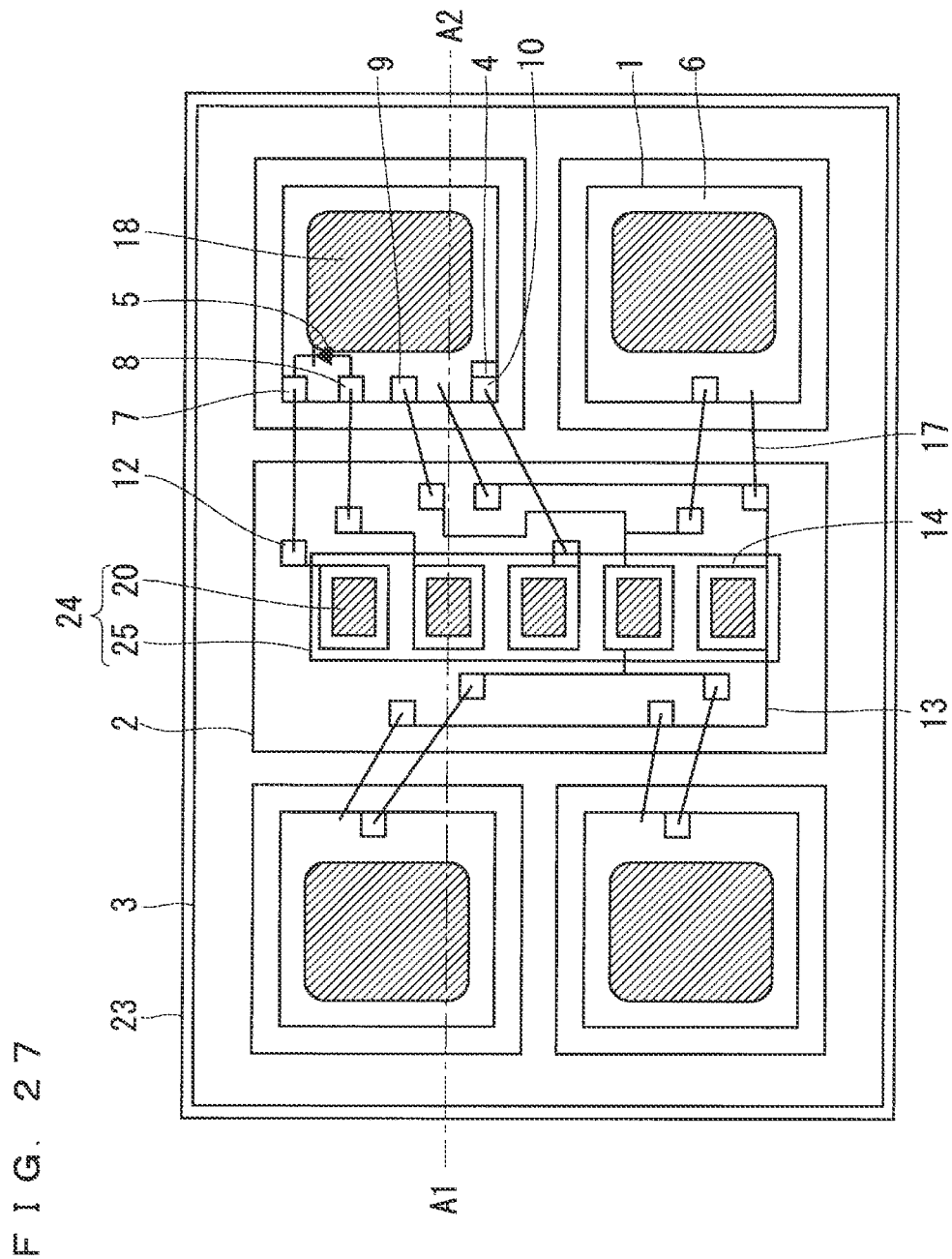
FIG. 27 is a plan view for describing the method of manufacturing the semiconductor device according to the embodiment 2.
Figure 28:
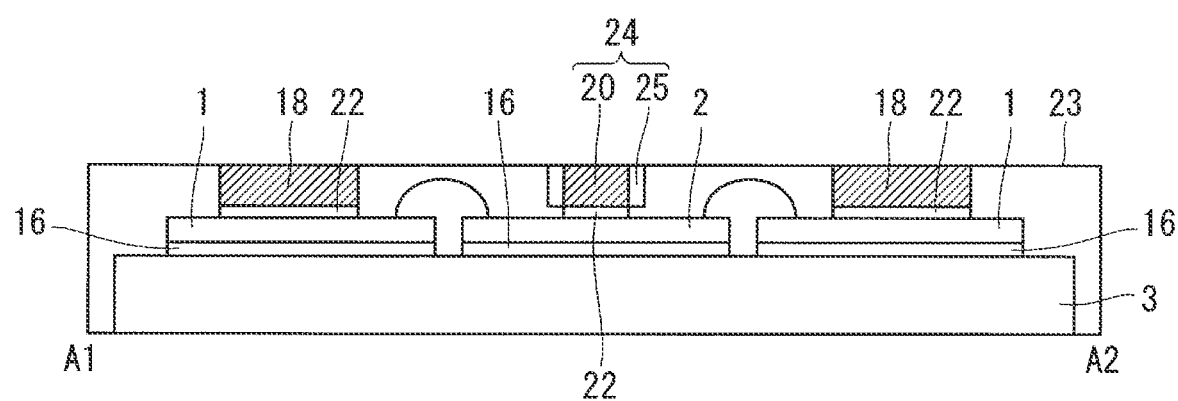
FIG. 28 is a cross-sectional view for describing the method of manufacturing the semiconductor device according to the embodiment 2.

As illustrated in FIGS. 26 to 28, in the grinding process of Step S16 in FIG. 13, the grinding process is performed so that at least part of the first electrode material 18 and at least part of the second electrode material 24 are exposed. At this time, the shorting wire 26 is removed by grinding, and each connection part 20 remains as it is. Accordingly, the potential of each signal pad of each semiconductor element 1 is electrically in the open-circuit state.

Figure 29:
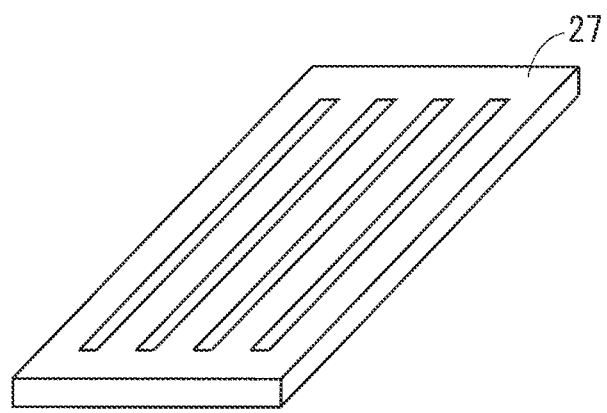
FIG. 29 is a diagram for describing a method of manufacturing a second electrode material according to the embodiment 2.
Figure 30:
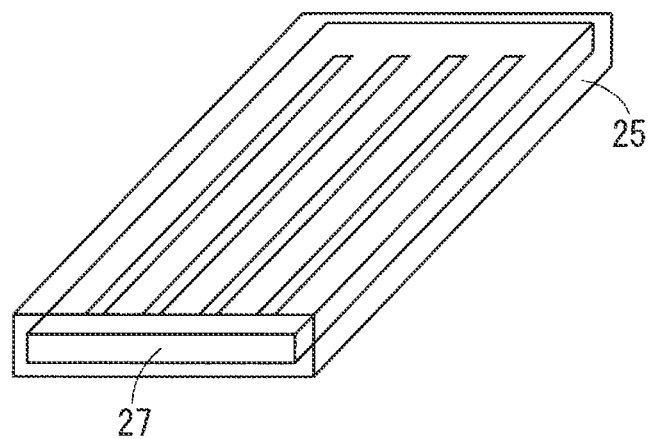
FIG. 30 is a diagram for describing the method of manufacturing the second electrode material according to the embodiment 2.

Herein, a method of manufacturing the second electrode material 24 is described. FIGS. 29 to 31 are diagrams for describing the method of manufacturing the second electrode material.

Firstly, as illustrated in FIG. 29, a conductive material 27 provided with slit-like holes is prepared. Next, as illustrated in FIG. 30, a surrounding area of the conductive material 27 is covered by the insulating material 25. Subsequently, as illustrated in FIG. 31, the conductive material 27 and the insulating material 25 are cut out in a vertical direction with respect to an extension direction of the holes in the conductive material 27. The second electrode material 19 is thereby formed.

<2-2. Effect>

The second electrode material 24 does not have the shorting part 21 described in the embodiment 1. Accordingly, it is sufficient that the shorting wire 26 and a redundant portion of the sealing resin 23 are ground in the grinding process of Step S16 in FIG. 13, thus an amount of the second electrode material 19 to be ground can be reduced as much as possible. The processing time and a frequency of exchanging a grind stone can be reduced, thus productivity of the semiconductor device can be improved.

In the wire bonding process of Step S12 in FIG. 13, not only the wire 17 but also the shorting wire 26 are connected at the same time, thus a process for connecting the shorting wire 26 needs not be newly added.

The second electrode material 19 is formed in each process illustrated in FIGS. 29 to 31, thus the positional tolerance can be reduced as much as possible, and the plurality of second electrode materials 19 can be formed from one conductive material 27. The second electrode material 19 formed in such a manner has a positioning accuracy similar to that in the embodiment 1.

Embodiment 3

<3-1. Manufacturing Method>

Figure 44:
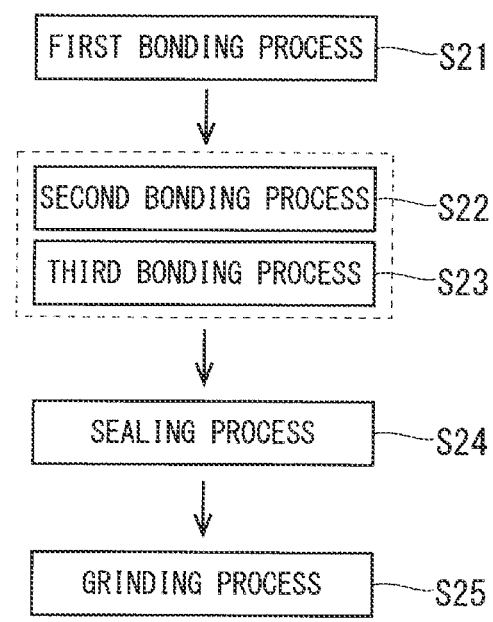
FIG. 44 is a flow chart illustrating an example of the method of manufacturing the semiconductor device according to the embodiment 3.

FIGS. 32 to 43 are diagrams for describing a method of manufacturing a semiconductor device according to an embodiment 3. FIG. 44 is a flow chart illustrating an example of the method of manufacturing the semiconductor device according to the embodiment 3. The method of manufacturing the semiconductor device according to the embodiment 3 is described hereinafter with reference to FIGS. 32 to 44, however, the description is mainly focused on a process different from the method of manufacturing the semiconductor device according to the embodiment 1.

The semiconductor device according to the embodiment 3 does not include the relay substrate 2. Accordingly, each process illustrated in FIG. 44 does not have a process corresponding to the wire bonding process of Step S12 in FIG. 13.

Figure 33:
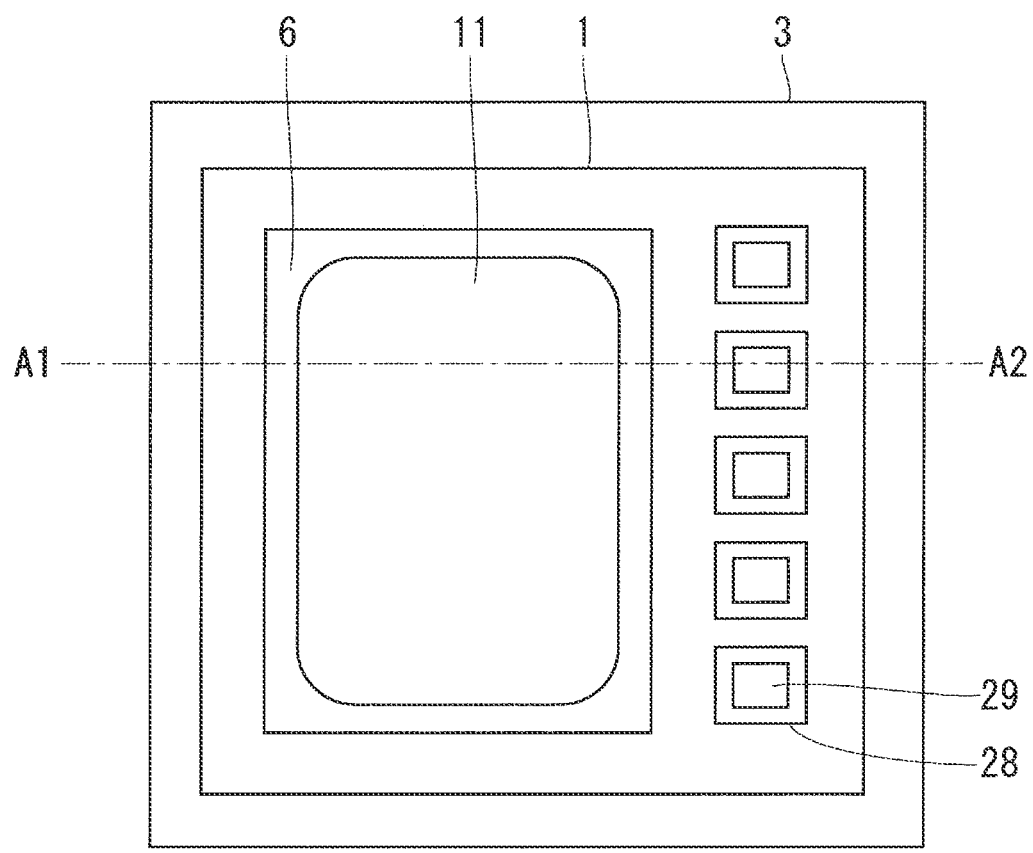
FIG. 33 is a plan view for describing the method of manufacturing the semiconductor device according to the embodiment 3.

As illustrated in FIGS. 32 to 34, in a first bonding process of Step S21 in FIG. 44, the semiconductor element 1 is bonded on the conductor plate 3 using the bonding material 16. The semiconductor element 1 includes the main cell part and the sense cell part. The semiconductor element 1 includes a plurality of signal terminals 28, and each signal terminal 28 is provided with a connection film 29.

Figure 37:
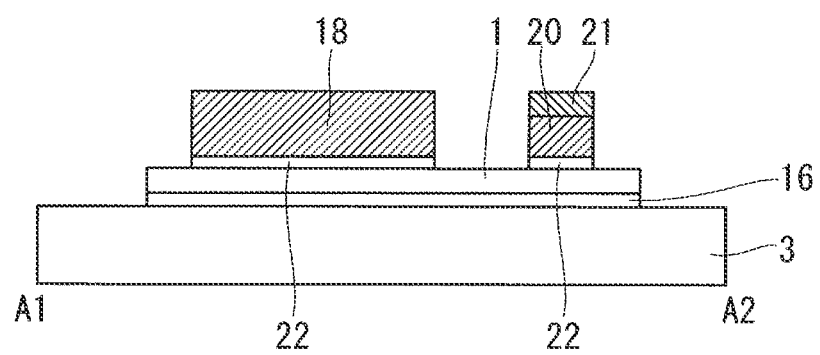
FIG. 37 is a cross-sectional view for describing the method of manufacturing the semiconductor device according to the embodiment 3.

As illustrated in FIGS. 35 to 37, in a second bonding process of Step S22 in FIG. 44, the first electrode material 18 is bonded to the connection film 11 provided on the semiconductor element 1 using the bonding material 22.

As illustrated in FIGS. 35 to 37, in a third bonding process of Step S23 in FIG. 44, the second electrode material 19 is bonded to the connection film 29 provided on each signal terminal 28 of the semiconductor element 1 using the bonding material 22. Accordingly, potential of each signal terminal 28 is electrically in a short-circuit state.

Each process of Step S22 and Step S23 described above is not necessarily performed in this order, but may be performed in a reverse order.

Figure 38:
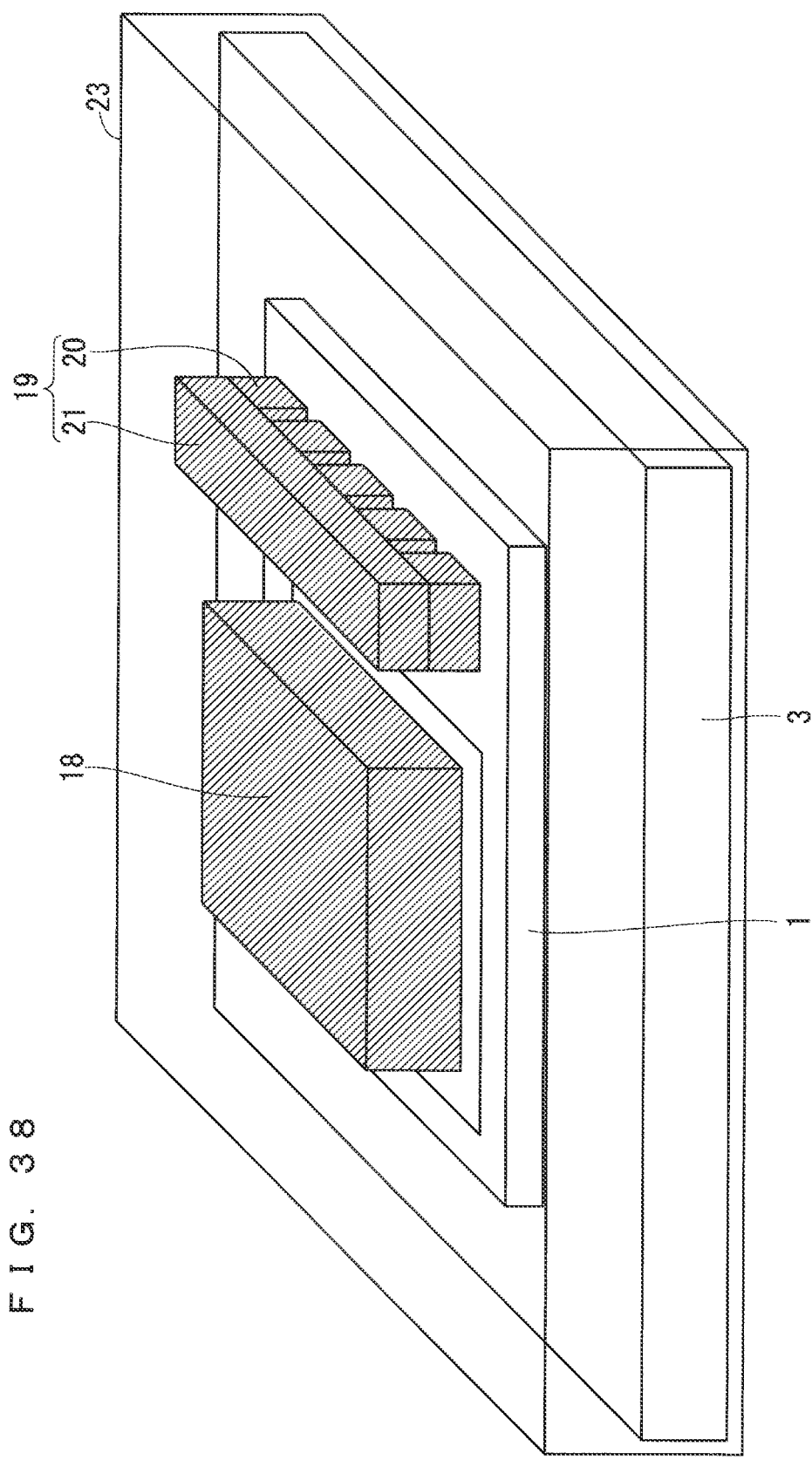
FIG. 38 is a bird's eye view for describing the method of manufacturing the semiconductor device according to the embodiment 3.
Figure 39:
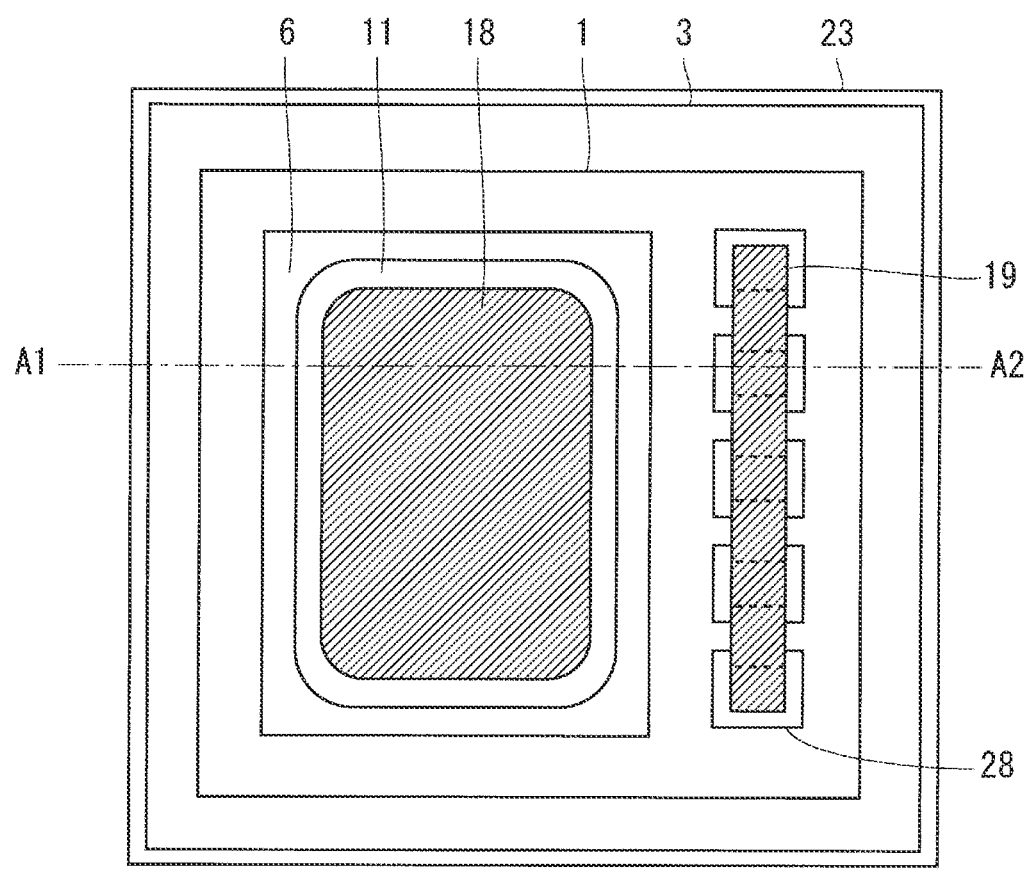
FIG. 39 is a plan view for describing the method of manufacturing the semiconductor device according to the embodiment 3.

As illustrated in FIGS. 38 to 40, in the sealing process of Step S24 in FIG. 44, the semiconductor element 1, the conductor plate 3, the first electrode material 18, and the second electrode material 19 are sealed with the sealing resin 23 and fixed. In the example in FIGS. 38 to 40, surfaces of the first electrode material 18 and the second electrode material 19 are exposed, but may be covered by the sealing resin 23.

Figure 42:
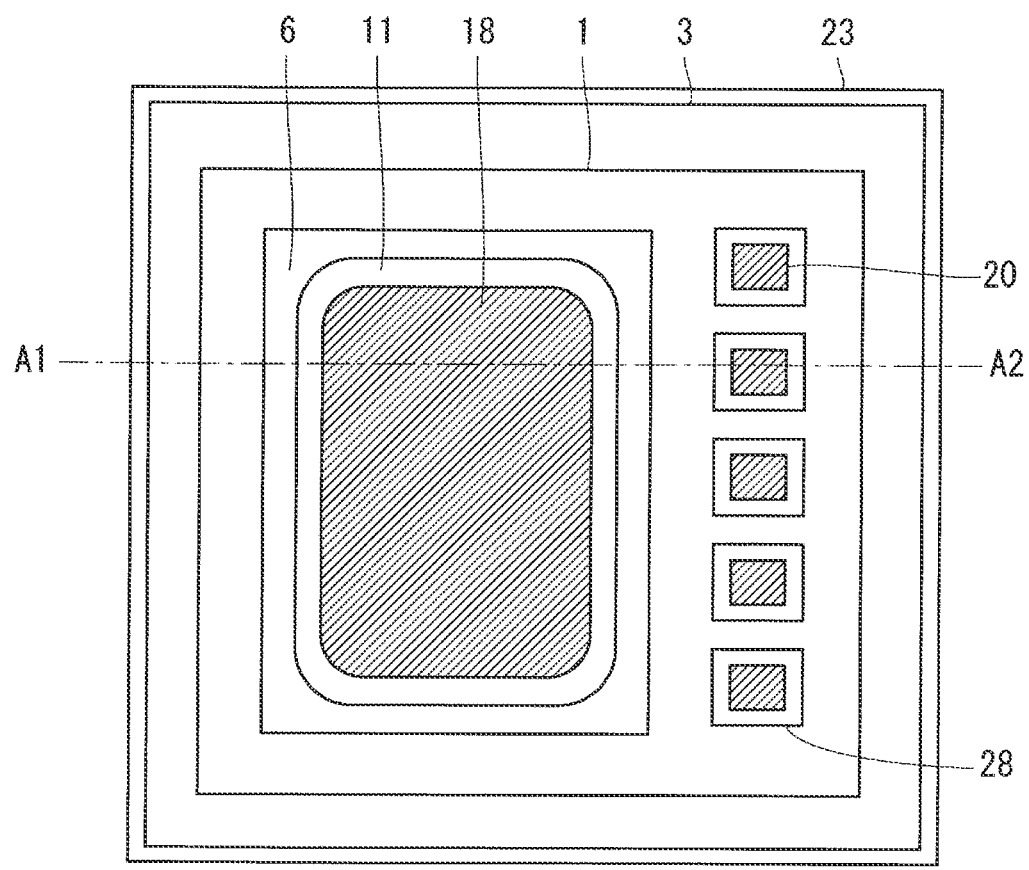
FIG. 42 is a plan view for describing the method of manufacturing the semiconductor device according to the embodiment 3.

As illustrated in FIGS. 41 to 43, in the grinding process of Step S25 in FIG. 44, the grinding process is performed so that at least part of the first electrode material 18 and at least part of the second electrode material 19 are exposed. At this time, the shorting part 21 of the second electrode material 19 is removed by grinding, and each connection part 20 remains as it is. Accordingly, the potential of the signal terminal 28 of the semiconductor element 1 is electrically in the open-circuit state.

<3-2. Effect>

The semiconductor device according to the embodiment 3 includes one semiconductor element 1 having the main cell part and the sense cell part. The semiconductor device is manufactured by the above manufacturing method, thus the effect similar to that in the embodiment 1 is obtained.

Described above is the case of manufacturing the semiconductor device using the second electrode material 19 described in the embodiment 1, however, the method of manufacturing the semiconductor device is not limited thereto. The semiconductor device may be manufactured using the second electrode material 24 described in the embodiment 2, and in this case, the effect similar to that in the embodiment 2 is obtained.

Each embodiment can be arbitrarily combined, or each embodiment can be appropriately varied or omitted within the scope of the present disclosure.

What is claimed is:

1. A method of manufacturing a semiconductor device which includes:

a plurality of semiconductor elements including a semiconductor element which has a main cell part and at least one sense cell part and is provided with a plurality of signal pads corresponding to the main cell part and the sense cell part, respectively; and a relay substrate provided with a plurality of control pads, the method comprising:

(a) bonding each of the semiconductor elements and the relay substrate on a conductor plate;

(b) connecting each of the signal pads of each of the semiconductor elements and each of the control pads of the relay substrate by a wire;

(c) bonding a first electrode material on each of the semiconductor elements;

(d) bonding a second electrode material having a shorting part shorting each of the control pads on the relay substrate;

(e) sealing the conductor plate, each of the semiconductor elements, the relay substrate, the first electrode material, and the second electrode material by resin; and (f) grinding the resin and removing the shorting part to expose part of the second electrode material.

2. The method of manufacturing the semiconductor device according to claim 1, wherein the semiconductor element is made of SiC and the relay substrate is made of Si.

3. The method of manufacturing the semiconductor device according to claim 1, wherein the relay substrate includes a plurality of control terminals electrically connected to each of the control pads, and the second electrode material includes a plurality of connection parts corresponding to each of the control terminals and the shorting part joining each of the connection parts.

4. The method of manufacturing the semiconductor device according to claim 2, wherein the relay substrate includes a plurality of control terminals electrically connected to each of the control pads, and the second electrode material includes a plurality of connection parts corresponding to each of the control terminals and the shorting part joining each of the connection parts.

5. The method of manufacturing the semiconductor device according to claim 3, wherein each of the connection parts and the shorting part are integrally formed.

6. The method of manufacturing the semiconductor device according to claim 4, wherein each of the connection parts and the shorting part are integrally formed.

7. The method of manufacturing the semiconductor device according to claim 3, wherein in the (d), each of the connection parts is electrically connected to each of the control terminals, and then each of the connection parts and the shorting part are electrically connected to each other.

8. The method of manufacturing the semiconductor device according to claim 4, wherein in the (d), each of the connection parts is electrically connected to each of the control terminals, and then each of the connection parts and the shorting part are electrically connected to each other.

9. The method of manufacturing the semiconductor device according to claim 7, wherein the shorting part is a plurality of wires connecting the connection parts adjacent to each other, and in the (d), each of the connection parts is electrically connected to each of the control terminals, and then each of the wires is wire-bonded to electrically connect each of the connection parts.

10. The method of manufacturing the semiconductor device according to claim 8, wherein the shorting part is a plurality of wires connecting the connection parts adjacent to each other, and in the (d), each of the connection parts is electrically connected to each of the control terminals, and then each of the wires is wire-bonded to electrically connect each of the connection parts.

11. The method of manufacturing the semiconductor device according to claim 3, wherein each of the connection parts is formed by covering a surrounding area of a conductive material provided with a plurality of slit-like holes by an insulating material, and then cutting out the conductive material and the insulating material in a vertical direction with respect to an extension direction of the holes.

12. The method of manufacturing the semiconductor device according to claim 4, wherein each of the connection parts is formed by covering a surrounding area of a conductive material provided with a plurality of slit-like holes by an insulating material, and then cutting out the conductive material and the insulating material in a vertical direction with respect to an extension direction of the holes.

13. A method of manufacturing a semiconductor device including a semiconductor element which has a main cell part and at least one sense cell part and is provided with a plurality of signal pads corresponding to the main cell part and the sense cell part, respectively, the method comprising:

(a) bonding the semiconductor element on a conductor plate;

(b) bonding a first electrode material on the semiconductor element;

(c) bonding a second electrode material having a shorting part shorting each of the signal pads on the semiconductor element;

(d) sealing the conductor plate, the semiconductor element, the first electrode material, and the second electrode material by resin; and (e) grinding the resin and removing the shorting part to expose part of the second electrode material.

\* \* \* \* \*